United States Patent [19]
Aozasa et al.

[11] Patent Number: 5,751,037
[45] Date of Patent: May 12, 1998

[54] NON-VOLATILE MEMORY CELL HAVING DUAL GATE ELECTRODES

[75] Inventors: Hiroshi Aozasa; Yutaka Hayashi, both of Kanagawa, Japan

[73] Assignee: Sony Corporation, Japan

[21] Appl. No.: 686,561

[22] Filed: Jul. 26, 1996

[30] Foreign Application Priority Data

Jul. 27, 1995 [JP] Japan ................................ 7-192118
Feb. 16, 1996 [JP] Japan ................................ 8-029718

[51] Int. Cl.$^6$ .......................... H01L 29/76; H01L 29/788
[52] U.S. Cl. ................... 257/315; 257/67; 257/70; 257/318; 257/321
[58] Field of Search ................... 257/67, 70, 315, 257/317, 321, 701

[56] References Cited

U.S. PATENT DOCUMENTS

| | | | |
|---|---|---|---|
| 4,667,217 | 5/1987 | Janning | 257/67 |
| 4,669,062 | 5/1987 | Nakano | 257/67 |
| 5,136,540 | 8/1992 | Hayashi et al. | 365/185 |
| 5,488,243 | 1/1996 | Tsuruta et al. | 257/314 |
| 5,567,959 | 10/1996 | Mineji | 257/69 |

FOREIGN PATENT DOCUMENTS 4-323875  11/1992  Japan ............................ 257/67

*Primary Examiner*—Mahshid D. Saadat
*Assistant Examiner*—Valencia Martin Wallace
*Attorney, Agent, or Firm*—Ronald P. Kananen

[57] ABSTRACT

A non-volatile memory device in which gate electrodes are formed on an upper surface and a lower surface of the channel via insulating layers, respectively, one of them is used as a read electrode and the other is used as a write electrode, whereby, at a read operation the reading is carried out without exerting an influence upon stored charges stored at the time of writing. Particularly, it has a structure in which a source and drain region of the non-volatile semiconductor memory device in formed in the semiconductor layer formed on the insulating layer and, at the same time, one of the read electrode and write electrode is buried in the insulating layer.

17 Claims, 28 Drawing Sheets

FIG. 1
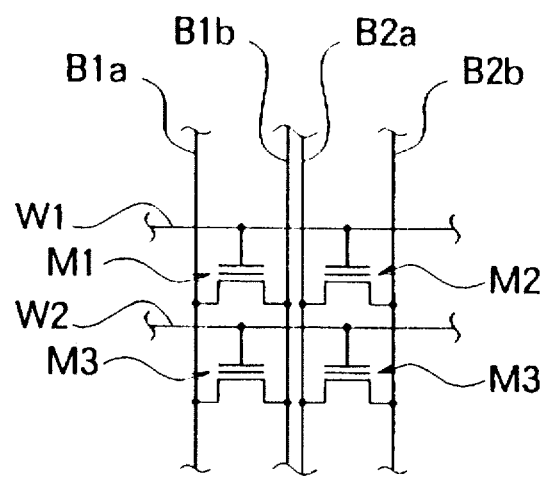
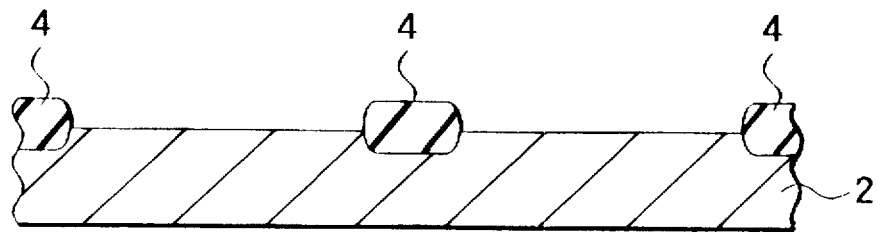
FIG. 2A
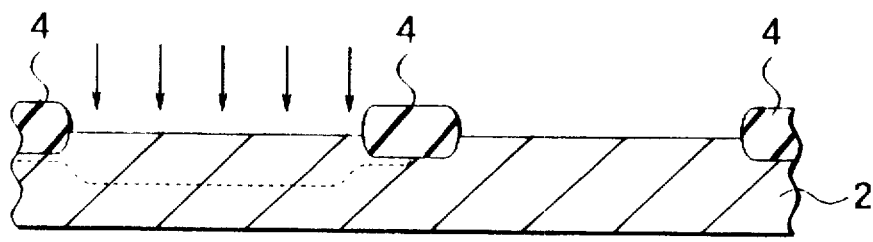
FIG. 2B
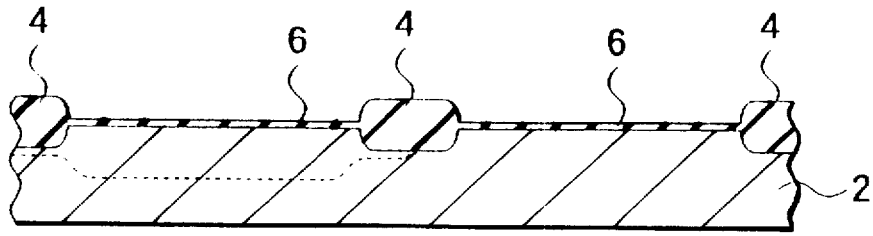
FIG. 2C

NON-VOLATILE MEMORY CELL HAVING DUAL GATE ELECTRODES

BACKGROUND OF THE INVENTION

1. Field of the Invention

The present invention relates to a non-volatile semiconductor memory device, more particularly relates to a non-volatile semiconductor memory having dual gate electrodes.

2. Description of the Related Art

A non-volatile semiconductor memory device is made to handle the write and read signals by shifting the threshold voltage by the charge existing in a charge storing mechanism formed in the insulating film.

For example, where the electrons are stored in the charge holding mechanism of a non-volatile semiconductor memory device of the N-type Metal-Oxide-Silicon (MOS) type, the threshold voltage is shifted to a positive direction. At the time of a read operation, a voltage is applied to the memory cell in question, but since the threshold voltage is larger than this applied voltage due to the electrons stored in this charge holding mechanism, the current flowing through the bit line is reduced. Conversely, where no electrons are stored in the charge holding mechanism or positive holes are stored, the threshold voltage is shifted to a negative direction, therefore the amount of the current flowing at the time of a read operation becomes large.

In this way, the basic operating principle of the non-volatile semiconductor memory device lies in the use of the difference occurring in the current flowing through the transistor and making the magnitude of the current flowing at the time of a read operation correspond to the binary information.

Usually, the memory transistors are formed by a bulk process, impurities are introduced into channel parts and other portions, punch through or leakage between elements is prevented from occurrence, and, at the same time, the threshold value is controlled.

However, disadvantages are caused due to the formation of the insulating film and the ion implantation. To fix these, a high temperature heating step is necessary. Therefore, it is difficult to optimize the distribution of the impurities in the elements.

Further, in the sub-0.1 μm generation of gate lengths, the statistical fluctuation of the concentration of the impurities to be introduced becomes relatively large—so much so as to exert an influence upon the actual device. Therefore, the control of the threshold voltage becomes further difficult.

Especially, the statistical fluctuation of the concentration of the impurity of the channel part is directly related to the fluctuation of the threshold voltage of the element, therefore a uniform circuit operation no longer can be carried out. Thus it has been said that the 0.1 μm generation may become the limit of miniaturization of the bulk type of MOS transistors.

In order to avoid this, a MOS transistor having a configuration sandwiching by two gates a channel having a low impurity concentration using a silicon on insulator (SOI) structure (structure in which a silicon monocrystalline layer is isolated via an insulating layer) or the like (a so-called XMOS transistor) has been proposed.

Since the gate electrode used for writing/erasing and the gate electrode accessed at the time of a read operation are the same, the voltage is applied both to the gate electrodes of the transistor accessed at the time of reading data and the non-selected transistors connected to the same word line W1, W2, or the like. For this reason, the non-selected memory cells also enter into a weak writing state whereby the data is destroyed. This disadvantage, called the "reading disturbance", has been difficult to eliminate.

Further, the closer one gets to this generation of miniaturization, the more it is required that the program voltage of the non-volatile semiconductor memory device be reduced as much as possible and the more it is required to reduce the thickness of the insulating layer and the ferroelectric film constituting part of the charge holding mechanism, but this conversely aggravates the effect of the reading disturbance.

Further, since the memory unit, the peripheral circuits, and the other circuits (logic etc.) have different structures of gate insulating layers, it is necessary to form the gate electrodes divided in two or three steps.

Further, the semiconductor layer is in an electrically floating state since it is completely surrounded by an insulator. For this reason, charges which are not absorbed by the source (for example, positive holes in the case of an NMOS) among the charges generated during the operation of the element, for example, the charges electrolytically dissociated due to collision at the drain end, are stored in the semiconductor layer, which changes the potential.

Such a change of the potential changes the threshold voltage and consequently becomes a cause preventing a uniform circuit operation.

SUMMARY OF THE INVENTION

An object of the present invention is to provide a non-volatile semiconductor memory device capable of miniaturization exceeding the limit of the above mentioned MOS transistors, in more detail, capable of suppressing fluctuation of a gate threshold voltage due to the fluctuation of a channel impurity concentration and reducing the soft write phenomenon (reading disturbance) due to reading and further having a good match with the manufacturing process of a logic circuit and drawing the change existing in the semiconductor layer in which channel region is formed prevent from the potential fluctuation.

According to the present invention, there is provided a non-volatile semiconductor memory device comprising a semiconductor layer in which a channel region is formed; a first insulating layer and a second insulating layer which are respectively formed on the two sides of the semiconductor layer; and a first electrode and a second electrode formed on the two sides of the channel region of the semiconductor layer via the first insulating layer and second insulating layer, respectively, wherein at least one of the first insulating layer and the second insulating layer has a function of storing charges.

Preferably, the thickness of the semiconductor layer is of an extent that the field of one surface of the semiconductor layer exerts an influence upon the other surface.

Preferably, the first insulating layer has a charge storing function; the first electrode is a write electrode; and the second electrode is a read electrode.

Preferably, one of the first insulating layer and second insulating layer is constituted by a multi-layer insulating film and has a charge storing function.

Preferably, a floating gate is buried in one of the first insulating film and second insulating film and the charges are stored in the floating gate.

Preferably, at least one of the first insulating layer and second insulating layer contains a ferroelectric layer.

Preferably, a source and drain region of the semiconductor layer is formed on a third insulating layer.

The semiconductor layer may be formed by epitaxial growth.

Preferably, the semiconductor layer is formed on the semiconductor substrate via a third insulating layer and, at the same time, connected to the semiconductor substrate via a connecting opening provided in one part of the insulating layer.

A plurality of channel layers may be connected in series in the semiconductor layer.

An electrode may be provided for draining the charges in the channel formed in the semiconductor layer.

Preferably, an electrode is provided for draining the charges in the channel formed in the semiconductor layer.

The lengths of the first gate electrode and second gate electrode in the channel direction may be different.

As stated above, a non-volatile semiconductor memory device according to the present invention comprises a semiconductor layer in which a channel region is formed; a first insulating layer and a second insulating layer formed on the two sides of the channel region of the semiconductor layer, respectively; a first electrode and a second electrode laid on the two sides of the channel region of the semiconductor layer via the first insulating layer and second insulating layer, respectively; and a charge storing layer having a charge storing function formed in at least one layer of the first insulating layer and second insulating layer.

In the present invention, preferably the thickness of the semiconductor layer is a thickness of an extent such that the field of one surface of the semiconductor layer influences the other surface.

The thickness d of an extent such that the field of one surface of the semiconductor layer influences the other surface can be defined by for example the following approximation:

$$d \leq (4\epsilon\phi_F/qN_B)^{1/2} \quad (1)$$

$$\phi_F = (kT/q)\ln(N_B/n_i)$$

Note, where the impurity concentration $N_B$ of the channel region of the semiconductor layer approaches the true carrier concentration, the following equation is used:

$$d \leq (\epsilon kT/2n_i q^2)^{1/2} \quad (1')$$

In the equations, $\epsilon$ is the dielectric rate of the semiconductor layer;

$\phi_F$ is the difference of the work functions; q is the amount of the charge of the electrons;

$N_B$ is the concentration of accepters of the channel region of the semiconductor layer, k is a Boltzmann constant, T is an absolute temperature, and $n_i$ is the true carrier density.

The above equations (1) and (1') show the spread of the depletion layer when the inversion layer starts to be formed in the channel region of the semiconductor layer. This can be considered to be the thickness where the field of one surface of the semiconductor layer influences the other surface. For example, when it is assumed that the semiconductor layer is a monocrystalline silicon layer and the impurity concentration of the channel region is $10^{17}/cm^3$ or more, the thickness d found from equation (1) is about 100 nm or less.

Preferably the first electrode is used as the write electrode for storing the charges in the charge storing layer in the first insulating layer, and the second electrode is used as the read electrode for the data.

The charge storing layer can be constituted by multi-layer insulating layer. As a multi-layer insulating layer having a charge storing function, an ONO film (laminate of a silicon oxide film, a silicon nitride film, and another silicon oxide film), an ON film (a laminate of a silicon oxide film and a silicon nitride film), etc. can be mentioned. Alternatively, the charge storing layer can be constituted by a floating gate buried in the first insulating layer or the second insulating layer. The floating gate can be constituted by a silicide metal, for example, polycrystalline silicon or tungsten silicide, a "polycide" film (laminate of a polycrystalline silicon film and a silicide film), or the like. Alternatively, it is also possible to include the ferroelectric layer in one or more of the first insulating layer and second insulating layer. As the ferroelectric layer, for example, a PZT (Pb-Zr-Ti-O), PLZT (Pb-La-Zr-Ti-O), $Y_1(SrBi_2Ta_2O_3)$, PT ($PbTiO_3$), etc. can be used.

Preferably the semiconductor layer is constituted by an SOI type semiconductor layer formed on an SOI type insulating layer.

It is also possible to form the semiconductor layer by epitaxial growth.

In the non-volatile semiconductor memory device according to the present invention, a so-called XMOS structure is adopted in which the first electrode and second electrode are laid on the two sides of the channel region of the semiconductor layer via the first insulating layer and the second insulating layer, respectively. For this reason, it becomes unnecessary to control the threshold voltage by the impurity concentration of the channel region as in the MOS transistor of the related art.

The threshold voltage is controlled by the impurity concentration of the channel region in a related art, and therefore a fluctuation of the threshold voltage of the gate electrode is caused due to the statistical fluctuation of the impurity concentration of the channel along with the miniaturization of the channel length. For this reason, in the structure of the related art, it has been said that about 0.1 μm is the limit of a MOS transistor.

Contrary to this, since the present invention adopts a so-called XMOS structure, it is not affected by the statistical fluctuation of the impurity concentration of the channel. The threshold voltage can be controlled by the relationship of the work function with the first electrode, the second electrode, and the channel region. Therefore, miniaturization is possible even after the 0.1 μm generation—which has been said to be the limit of miniaturization of the related art of bulk MOS transistors.

Further, in the present invention, since two facing electrodes are made to share the functions of the write operation (and erasing) and the read operation, the soft write (erroneous writing) state of the non-selected cells during the read operation is reduced and the reading disturbances can be prevented. This is because, in the present invention, the disturbing field becomes for example a half or less in comparison with the case of the related art. In general, the amount of change of the charge is represented by an exponential function of the field in most cases, therefore, in the present invention, it is expected that the amount of disturbance can be further reduced to less than a half.

In the present invention, on both sides of the semiconductor layer, the first electrode or the second electrode on the side where the charge storing layer is formed becomes the write electrode. The charges are stored in the charge storing layer by the write electrode. Due to the influence of the charges of the charge storing layer, the threshold voltage of the read electrode on the opposite side when sandwiching the semiconductor layer therebetween changes. Due to the change of the threshold voltage, the read operation of the data is carried out. According to experiments by the present inventors, it was confirmed that: where the value obtained by converting the charges stored in the charge storing layer to the voltage of the second electrode is defined as $V_{g1}$ and the threshold voltage of the read electrode is defined as $V_{thu}$, the change of that threshold voltage is represented by the following theoretical equation:

$$\partial V_{thu}/\partial V_{g1} = -(C_{in1}/C_{inu})/(C_{in1}+C_{si})$$

In the equation, $C_{in1}$ indicates the capacitance of the insulating layer between the charge storing layer and the semiconductor layer, $C_{inu}$ indicates the capacitance between the semiconductor layer and the read electrode, and $C_{si}$ indicates the capacitance of the semiconductor layer in which the channel region is formed.

According to experiments in which the semiconductor layer was formed on the surface of a P-type substrate via an insulating layer by using lateral solid phase epitaxial technology and the electrodes were formed on the semiconductor layer via the insulating layer, the change of $V_{thu}$ with respect to the change of $V_{g1}$ is about −0.18 ($V_{thu}$ changes by about 0.8V to about 0.45V during the period where $V_{g1}$ changes from −1 to +1V). It was confirmed that this substantially coincided with the value by the above theoretical equation. Namely, it was confirmed that the threshold voltage of the read electrode on the opposite side when sandwiching the semiconductor layer sufficiently changed due to the influence of the charges of the charge storing layer.

Further, in the present invention, the insulating layer and electrode of either of the first insulating layer and first electrode or the second insulating layer and second electrode can be prepared in the same way as the process of preparing the other circuits such as the peripheral circuits. For this reason, there is a high process compatibility with the other circuits besides those of the memory cell portion.

Further, in the present invention, since an electrode for draining the charges existing in the semiconductor layer is connected to at least one part of the semiconductor layer, the potential in the semiconductor layer can be kept. Due to this, uniform circuit operation is guaranteed.

BRIEF DESCRIPTION OF THE DRAWINGS

These and other objects and features of the present invention will become more apparent from the following description of he preferred embodiments made with reference to the appended drawings, in which:

FIG. 1 is an equivalent circuit diagram of a non-volatile memory array of a first embodiment;

FIG. 2A to FIG. 2I are process diagrams showing a manufacturing process of the non-volatile semiconductor memory shown in FIG. 1;

DESCRIPTION OF THE PREFERRED EMBODIMENTS

A typical equivalent circuit diagram of a memory array of a non-volatile semiconductor memory device is shown in FIG. 1. The memory shown in FIG. 1 is a NOR type, in which word lines W1, W2 ... and pairs of bit lines B1a, B1b; B2a, B2b; ... are individually connected to respective memory cells M1 ... M4 ... in the form of a matrix.

Below, the process of manufacturing a first embodiment of such a non-volatile semiconductor memory device will be shown (here, a case where a multi-layer insulating film, particularly an ONO film, is used in the charge storing mechanism).

As shown in FIG. 2A, first, a field insulating film (silicon oxide film) 4 is formed on the surface of a semiconductor substrate 2 constituted by a monocrystalline silicon substrate or the like by a LOCOS process.

Next, as shown in FIG. 2B, the impurity is introduced into the memory region by using an ion implantation method or the like.

Next, as shown in FIG. 2C, a lower layer film 6 (bottom oxide film) of the gate insulating layer constituted by the ONO film is formed.

Figure 2D:
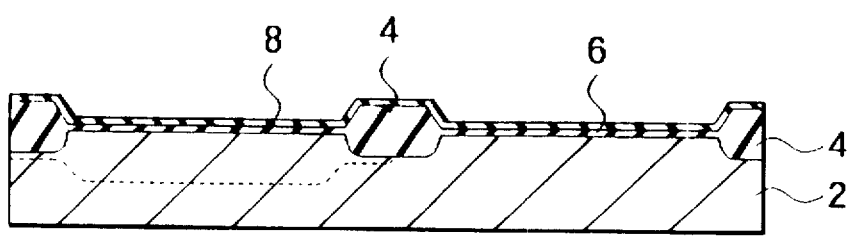

Next, as shown in FIG. 2D, a silicon nitride film 8 in the gate insulating layer constituted by an ONO film or the like is deposited by using a chemical vapor deposition (CVD) process or the like.

Figure 2E:
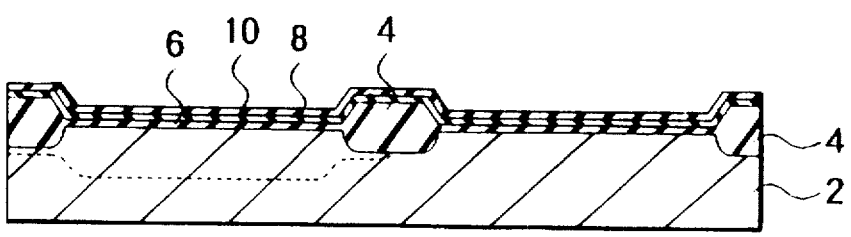

Next, as shown in FIG. 2E, an upper layer silicon oxide film 10 of an ONO film is formed by thermally oxidizing the silicon nitride film.

Figure 2F:
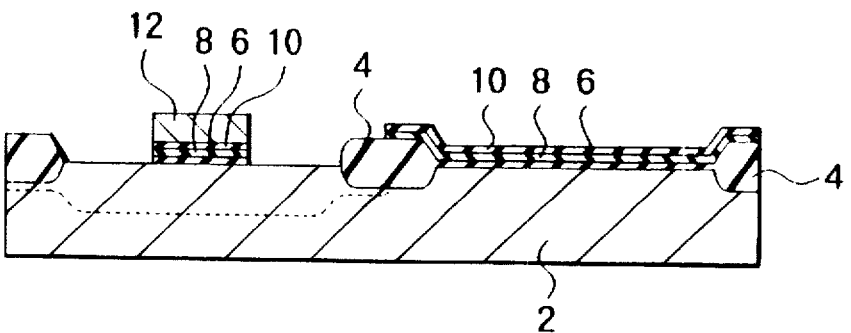

Next, as shown in FIG. 2F, a gate electrode material layer is formed by a CVD process or the like. This is patterned to form a control gate 12.

Figure 2G:
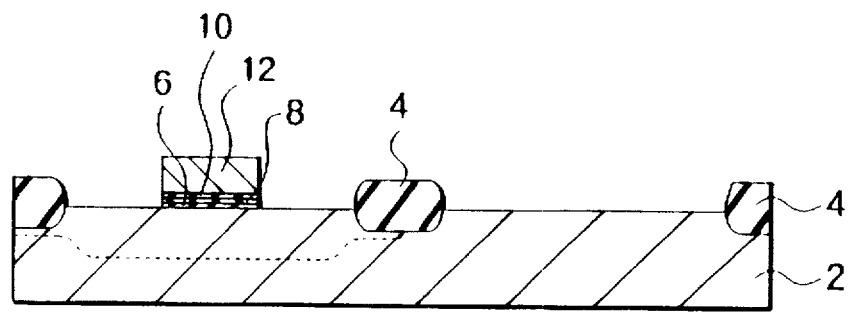

Next, as shown in FIG. 2G, in order to form the peripheral circuits and the other parts, the ONO film at the position other than the memory cell portion is once removed.

Figure 2H:
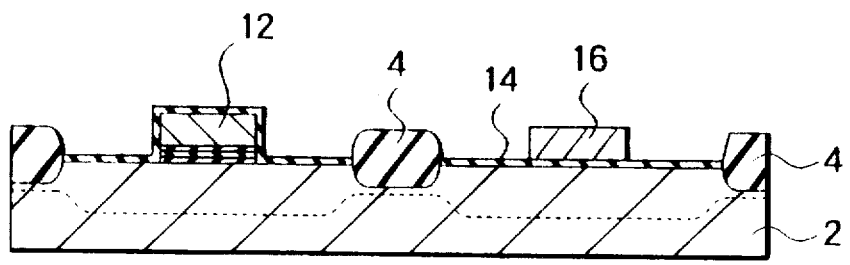

Next, as shown in FIG. 2H, the introduction of the impurity, formation of the gate oxide film 14, and the formation of the gate electrode 16 are carried out for the peripheral circuits and the other parts.

Figure 2I:
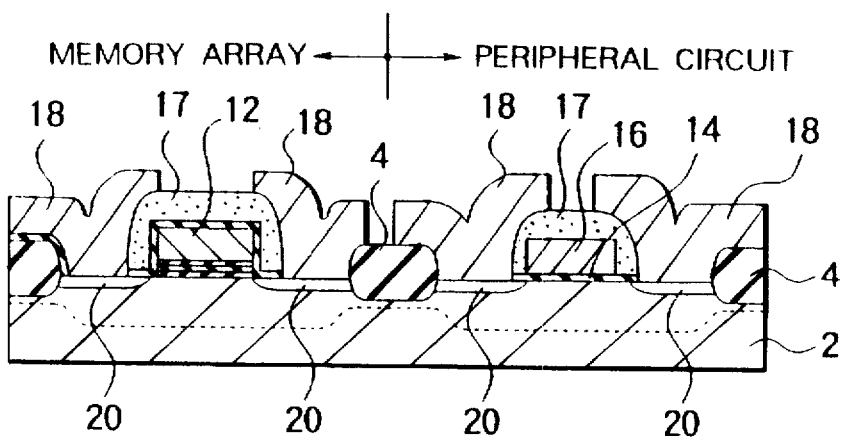

Next, as shown in FIG. 2I, a source-drain region 20 is formed on the surface of the semiconductor substrate 2 in a self-aligning manner with respect to the gate electrodes 12 and 16, an inter-layer insulating layer 17 is formed, and a take-out electrode 18 is attached to complete the device.

In a non-volatile semiconductor memory device configured in this way, where for example the data of the memory cell M1 shown in FIG. 1 is read, the word line W1 is accessed. Usually, NMOS transistors are used for the transistors of a non-volatile semiconductor memory device, therefore a positive voltage is applied to the word line W1. At almost the same time, a current flowing between the bit line B1a and the bit line B1b is detected, and it is decided whether the data is "1" or "0".

Note that, in the usual bulk process (process of forming the elements on a bulk semiconductor substrate), the film structure of the gate insulating layer differs between the memory cell part and the peripheral circuit, but the gates are formed on the same surface.

Figure 3:
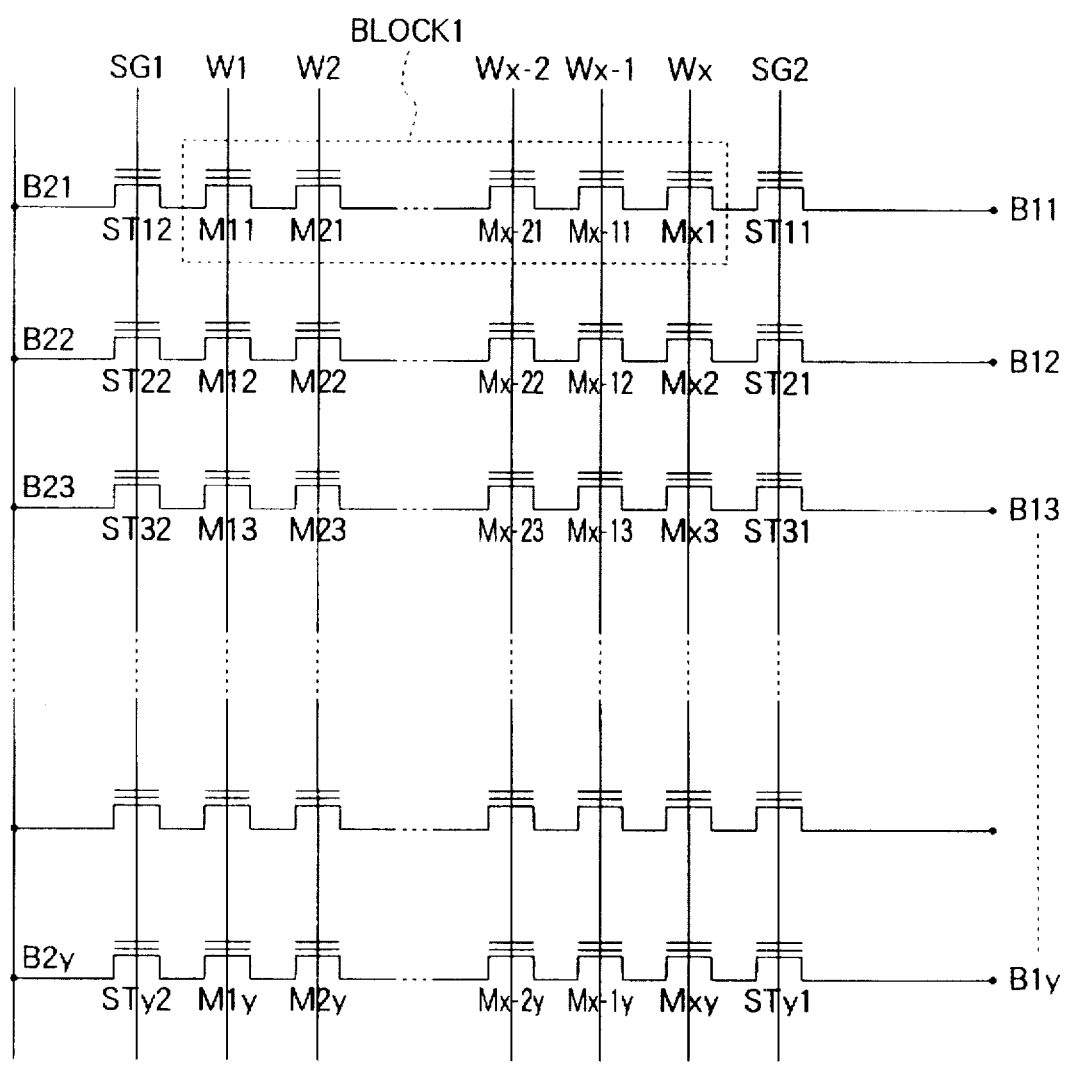
FIG. 3 is an equivalent circuit diagram of a non-volatile memory array of a second embodiment.

Next, a non-volatile semiconductor memory device of a second embodiment will be shown in FIG. 3. Usually, the arrangement is the method of arrangement referred to as the "NAND type", in which word lines W1, W2, ... and a pair of bit lines B1y, B2y for the number of connected mentioned before are individually connected to the respective memory cells $M_{11}, M_{12}, \ldots M_{xy}$.

For the preparation of such a non-volatile memory device, a process siilar to that for the above NOR type is used.

The operation of the non-volatile semiconductor memory device configured in this usually as follows.

In the read operation, the word line of the cell to be read is fixed to 0V and be applied a sufficient voltage (hereinafter referred to as Vcc) which makes all cell transistors become electrically conductive to the word lines other than this, and when a positive voltage is applied to the bit line B1y, all cell transistors other than the cell to be read are in the electrically conductive state, therefore where the current "flows" or "does not flow" through the bit line B2y is determined according to whether the selected cell transistor has become the normally on or normally off state.

The states where the current "flows" and "does not flow" respectively correspond to "1" and "0". Further, usually the erasing of the NAND type data is carried out in block units or all cells in the semiconductor chip.

This erasing is carried out by applying a sufficient voltage (hereinafter referred to as Vpp) to selective gate, well and substrate. Further bit line B11 and B21 is open.

As a result, electron are introduced from the storing phenomenon (mechanism) to the semiconductor layer in which a channel is formed, therefore the cell transistor becomes a depletion type (normally on). Therefore, a writing of data is carried out to the desired cell transistor.

Where all cell transistors are normally on, so data "0" is the written. In the "0" data is writing, the word line for performing the writing is applied to Vpp and a bit line is fixed to 0V and a voltage which makes all cell transistors become electrically conductive to the selection gate SG2 and the word lines other than this.

Therefore, an electron is introduced to the charge storing mechanism, and this time, the cell transistor becomes a enhancement type (normally off type). Further, where the data is writing, Vpp is applied to the non-selected cell's word line, and introduced an electron to its charge-stored cell's charge stored mechanism. Therefore, non selective cell transistors function as depletion (normally on) type transistors.

In a third embodiment of the present invention, the non-volatile semiconductor memory device is configured by using an ONO film is used as the charge storing layer and by utilizing a so-called XMOS structure.

Figure 4:
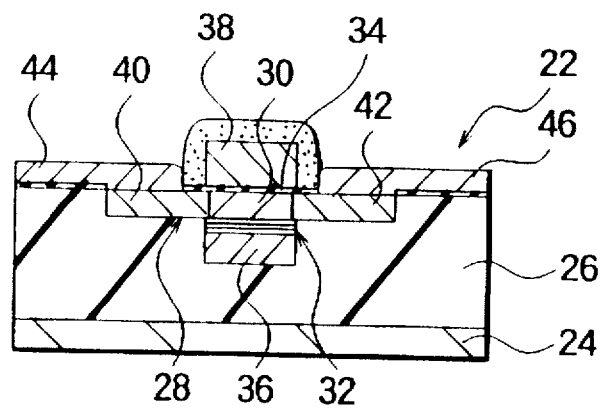
FIG. 4 is a sectional view of principal parts of the non-volatile memory cell of a third embodiment.

A sectional view of the principal parts of a memory cell in the non-volatile semiconductor memory device according to the present embodiment will be shown in FIG. 4.

As shown in FIG. 4, a non-volatile semiconductor memory device 22 according to the present embodiment has an SOI structure, in which an SOI type insulating layer 26 is formed on a supporting substrate 24, and an SOI type semiconductor layer 28 is formed on this SOI type insulating layer 26 in the form of an island. A first gate insulating layer 32 and a second gate insulating layer 34 are laid on the two sides of a channel region 30 of each semiconductor layer 28. Further, the first gate electrode 36 is laid on the first gate insulating layer 32 side and the second gate electrode 38 is laid on the second gate insulating layer 34 side. These are therefore located on the two sides of the channel region 30.

On the two sides of the channel region 30 of the semiconductor layer 28 along the plane direction, the source-drain regions 40 and 42 are formed in a self-aligning manner with respect to the second gate electrode 38. Further, interconnection layers 44 and 46 acting as bit lines electrically connected to these source-drain regions 40 and 42 are formed on the insulating layer 26.

In the present embodiment, the first gate insulating layer 32 is constituted by an ONO film (three-layer film of the silicon oxide film, the silicon nitride film, and another silicon oxide film) and constitutes the charge storing layer. The first gate electrode 36 becomes the electrode for writing the data (also for the erasing of data; the same is true for the following), and the second gate electrode 38 becomes the electrode for reading the data.

In the present embodiment, the thickness of the semiconductor layer 28 is a thickness of an extent that the field of one surface of the semiconductor layer 28 influences the other surface. The thickness of the semiconductor layer 28 is concretely determined by the above equation (1) or (1'). Where for example the semiconductor layer is a silicon single crystal and the impurity concentration of the channel region is $10^{17}/cm^3$ or more, it is for example about 100 nm or less.

Figure 5:
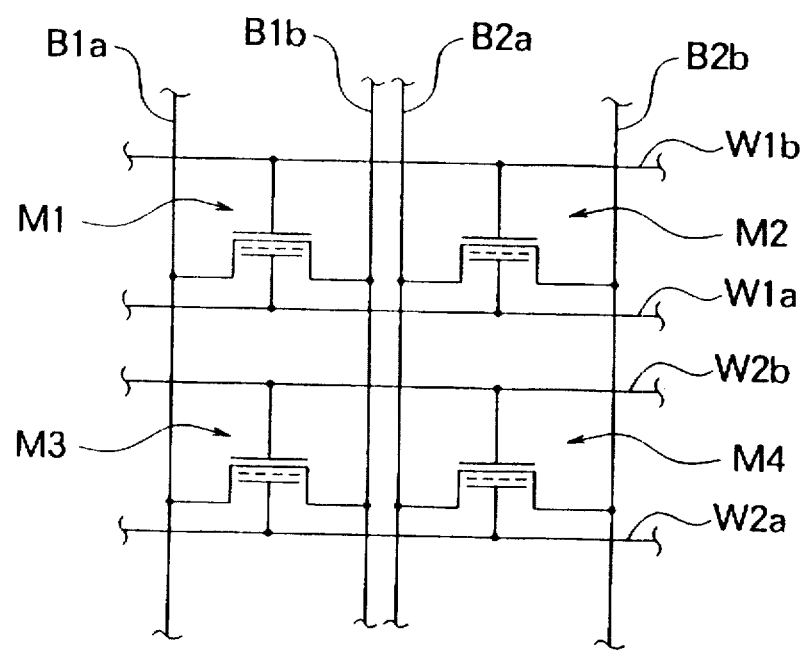
FIG. 5 is an equivalent circuit diagram of the non-volatile memory array of the third embodiment.

An equivalent circuit diagram of a memory cell of the non-volatile semiconductor memory device according to the present embodiment will be shown in FIG. 5. As shown in FIG. 5, the non-volatile semiconductor memory device according to the present embodiment is of the NOR type, in which write word lines W1a, W2a . . . , read word lines W1b, W2b . . . and pairs of bit lines B1a, B1b; B2a, B2b; . . . are individually connected to respective memory cells M1 . . . M4 . . . in the form of a matrix.

Next, an explanation will be made of an example of the manufacturing process of the non-volatile semiconductor memory device according to the present embodiment.

Figure 6A:
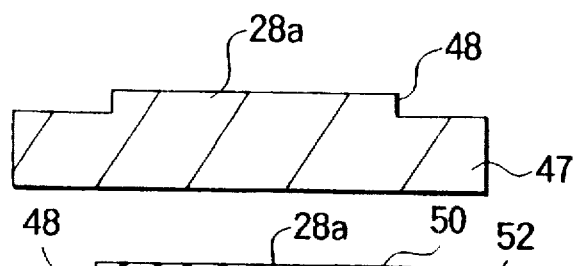
FIG. 6A to FIG. 6H are process diagrams showing the manufacturing process of the non-volatile semiconductor memory shown in FIG. 4.

First of all, as shown in FIG. 6A, a step difference 48 is formed on the surface of a semiconductor substrate 47 constituted by a silicon single crystal wafer or the like by using reactive ion etching (RIE) or the like, and a semiconductor layer projection 28a is formed in the form of an island.

Figure 6B:

Next, as shown in FIG. 6B, a silicon oxide film 50 is formed by a thermal oxidation method or the like, and a silicon nitride film 52 is formed on that silicon oxide film 50. The silicon nitride film 52 is formed by for example a CVD process. The thickness of the silicon oxide film 50 is not particularly limited, but for example may be about 1.0 to 3.0 nm. The thickness of the silicon nitride film 52 is about 2.0 to 20.0 nm.

Figure 6C:
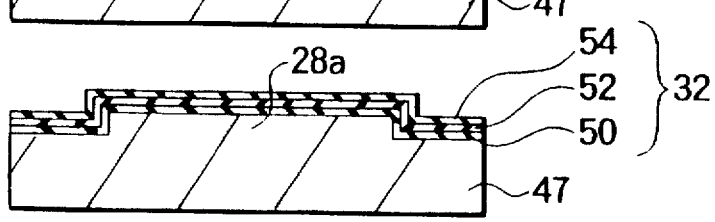

Thereafter, as shown in FIG. 6C, the surface of the silicon nitride film 52 is thermally oxidized, and a silicon oxide film 54 having a thickness of for example about 2.0 to 6.0 nm is formed. A first gate insulating layer 32 comprising an ONO film is formed by a silicon oxide film 54, a silicon nitride film 52, and a silicon oxide film 50.

Figure 6D:
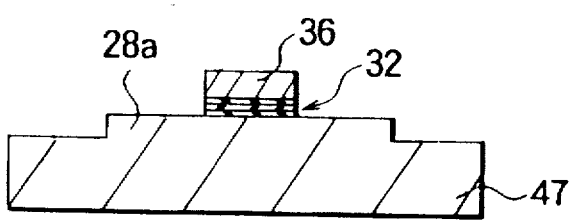

Next, as shown in FIG. 6D, as the gate material which becomes the first gate electrode 36, for example a polycrystalline silicon film or "polycide" film is formed by a CVD process or the like. This is etched to pattern the first gate electrode 36. Subsequently, the portion beneath the first gate electrode 36 other than the first gate insulating layer 32 is removed by etching. Of course, it is also possible to leave the silicon oxide film 54, the silicon nitride film 52, and the silicon oxide film 50.

Figure 6E:
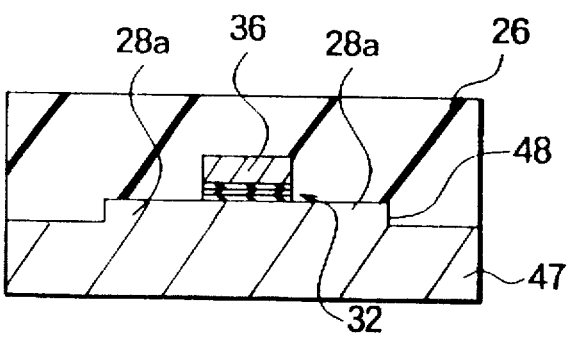

Next, as shown in FIG. 6E, an SOI type insulating layer 26 is formed on the semiconductor substrate 47 on which the first gate electrode 36 is formed. This insulating layer 26 is constituted by silicon oxide formed by for example a CVD process.

Figure 6F:
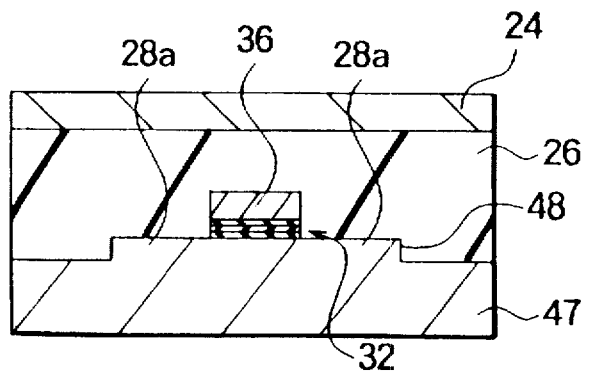

Next, as shown in FIG. 6F, a supporting substrate 24 is bonded to the surface of the SOI type insulating layer 26. In actuality, a leveling use polycrystalline silicon layer is deposited on the surface of the insulating layer 26 by a CVD process or the like and leveled by polishing the surface thereof by chemical mechanical polishing (CMP) or the like, and a supporting substrate 24 constituted by a silicon wafer or the like is bonded to that leveled surface. Namely, the method of forming the SOI structure according to the present embodiment is a so-called bonding SOI method.

Figure 6G:
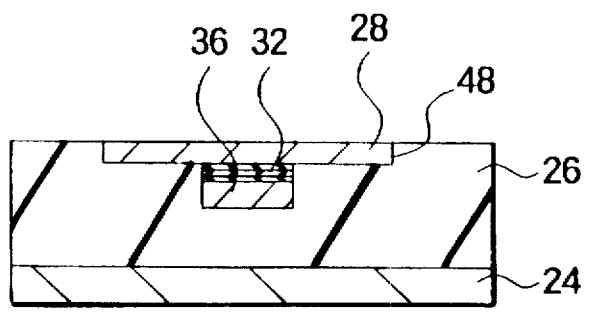

Next, as shown in FIG. 6G, the assembly is turned upside-down from the state shown in FIG. 6F and the surface of the semiconductor substrate 47 is polished by a CMP process or the like until the surface of the insulating layer 26 is exposed. The SOI type semiconductor layer 28 constituted by the silicon single crystal is left in the part corresponding to the step difference 48 (semiconductor layer projection 28a). The thickness of the SOI type semiconductor layer 28 left on the SOI type insulating layer 26 is a thickness of an extent that the field of one surface of the semiconductor layer 28 influences the other surface and for example is about 100 nm or less.

Figure 6H:
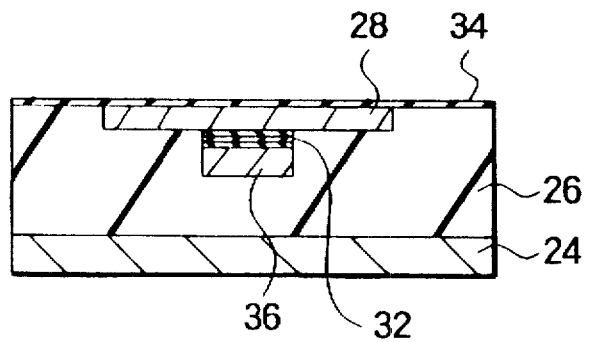

Next, as shown in FIG. 6H, the second gate insulating layer 34 is formed on the surface of the semiconductor layer 28. This second gate insulating layer 34 is constituted by for example a silicon oxide film and is formed by a thermal oxidation or CVD process. The thickness of this second gate insulating layer 34 is not particularly limited, but for example is about 2.0 to 10.0 nm. Note that, it is also possible to introduce an impurity for adjustment of the threshold value into the semiconductor layer 28 before or after the formation of the second gate insulating layer 34, but in the present embodiment, the introduction of the impurity can be omitted by setting the difference of the work functions between the gate material and the semiconductor layer to an appropriate value.

Next, as shown in FIG. 4, as the gate material layer which becomes the second gate electrode 38, for example a polycrystalline silicon film or a "polycide" film is deposited on the second gate insulating layer 34 by a CVD process or the like, the gate material layer is patterned by RIE or the like, and therefore the second gate electrode 38 is formed. Next, ion implantation of the impurity is carried out in a self-aligning manner with respect to this second gate electrode 38 to form the source-drain regions 40 and 42 on the semiconductor layer 28. The conditions for the ion implantation are not particularly limited, but As is used as the impurity and the ion implantation is carried out under conditions of 40 to 80 KeV, $3\times10^{15}$ to $5\times10^{15}/cm^2$. The channel region 30 is formed in the semiconductor layer 28 just beneath of the second gate electrode 38 to which the impurity is not introduced.

Thereafter, the interconnection layers 44 and 46 connected to the source-drain regions 40 and 42 are formed by a polycrystalline silicon interconnection layer, an aluminum interconnection layer, an aluminum alloy interconnection layer, or the like.

By the process as described above, the memory cells of the non-volatile semiconductor memory device 22 shown in FIG. 4 are produced.

In the non-volatile semiconductor memory device according to the present embodiment, as shown in FIG. 5, where the writing/erasing of the data is carried out, the write voltage is applied to the first gate electrode 36 for writing through the write word lines W1a, W2a . . . . This write voltage is not particularly limited, but is for example 5 to 9V. By the application of this write voltage, the charges are stored in the ONO film of the first gate insulating layer 32 constituting the charge storing layer. The field caused by these stored charges influences the surface of the second gate insulating layer 34 of the semiconductor layer 28.

For this reason, by applying the read voltage to the first gate electrode 38 for reading shown in FIG. 4 through the read word lines W1b, W2b ... shown in FIG. 5 at the time of reading data, the stored data can be read out. The read voltage is not particularly limited, but is for example about 0.7V.

In the structure of the non-volatile semiconductor memory device of the related art, the read electrode and the write electrode were the same, therefore there was a large possibility that erroneous writing (reading disturbance) would occur at the non-selected cells at a read operation of the data. In the present embodiment, the write electrode and the read electrode are different, therefore the inconvenience of reading disturbances etc. can be effectively prevented.

Further, the thickness of the second gate insulating layer 34 under the second gate electrode 38 which becomes the read electrode can be set relatively thick, i.e., about 6 to 8 nm, without considering the write voltage so as to be process compatible with the peripheral transistors. Conversely the thickness of the silicon oxide film in the first gate insulating layer 32 can be made thick to about 4 nm or less in order to reduce the write voltage.

Further, in the present embodiment, a so-called XMOS structure in which the first gate electrode 36 and the second gate electrode 38 are respectively laid on the two sides of the channel region 30 of the semiconductor layer 28 via the first gate insulating layer 32 and the second gate insulating layer 34 is adopted. For this reason, the threshold voltage can be controlled, without the influence of the statistical fluctuation of the channel impurity concentration, by the relationship of the work function with the first gate electrode 36, the second gate electrode 38, and the channel region 30, and miniaturization is possible even after the 0.1 μm generation—which has been said to be the limit of miniaturization of the related art of bulk MOS transistors.

Furthermore, in the present embodiment, it is possible to fabricate the second gate insulating layer 34 and the second gate electrode 38 in the same way as the manufacturing process of the other circuits such as the peripheral circuit. For this reason, there is a high process compatibility with the circuits other than the memory cell portion.

Figure 7:
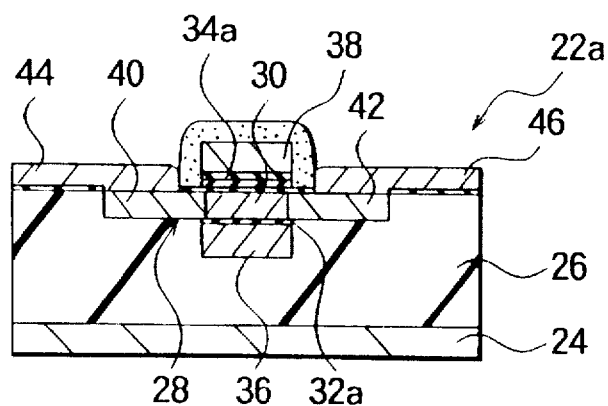
FIG. 7 is a sectional view of the principal parts of the non-volatile memory cell of a fourth embodiment.

In the fourth embodiment of the present invention, as shown in FIG. 7, a non-volatile semiconductor memory device 22a is produced in the same way as that for the first embodiment except the first gate insulating layer 32a is constituted by a single layer not having a charge storing function such as a silicon oxide film and the second gate insulating layer 34a is constituted by a charge storing layer such as an ONO film.

In the present embodiment, the first gate electrode 36 becomes the read gate electrode, and the second gate electrode 38 becomes the write gate electrode.

In the present embodiment, the same action and effect as those by the third embodiment can be expected.

Figure 8:
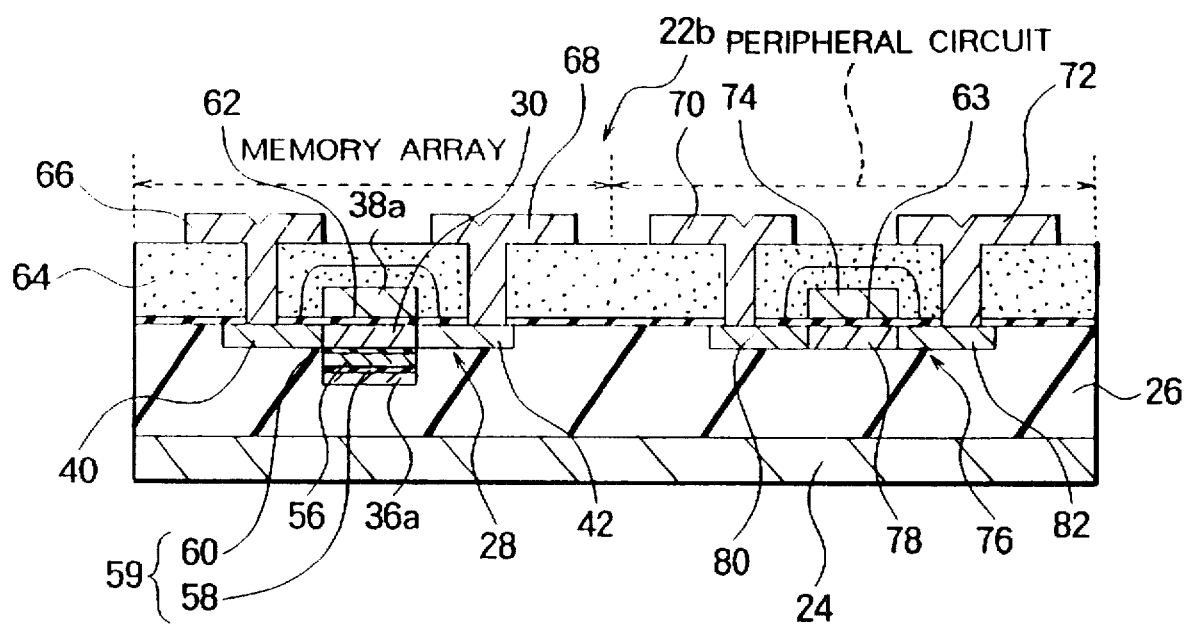
FIG. 8 is a sectional view of the principal parts of the non-volatile memory cell of a fifth embodiment.

In the fifth embodiment of the present invention, as shown in FIG. 8, the non-volatile semiconductor memory device is configured using a floating gate 56 as the charge storing layer and using an XMOS structure as a prerequisite.

As shown in FIG. 8, the non-volatile semiconductor memory device 22b according to the present embodiment has an SOI structure, in which the SOI type insulating layer 26 is formed on the supporting substrate 24, and the SOI type semiconductor layers 28 and 76 are formed on this SOI type insulating layer 26 in the form of islands. The semiconductor layer 28 is the SOI type semiconductor layer for the memory cell portion, and the semiconductor layer 76 is the SOI type semiconductor layer for the peripheral circuit portion. A first gate insulating layer 59 and a second gate insulating layer 62 are laid at the two sides of each semiconductor layer 28 in the memory cell portion. Further, the first gate electrode 36a is laid on the first gate insulating layer 59 side, and the second gate electrode 38a is laid on the second gate insulating layer 62 side. These are therefore located on the two sides of the channel region 30.

The first gate insulating layer 59 comprises an intermediate insulating layer 58 and a tunnel insulating layer 60. A floating gate 56 is interposed between these films 58 and 60. In the present embodiment, the floating gate 56 becomes the charge storing layer.

In the memory cell portion, on the two sides of the channel region 30 of the semiconductor layer 28 along the plane direction, the source-drain regions 40 and 42 are formed in a self-aligning matching manner with respect to the second gate electrode 38. Further, interconnection layers 66 and 68 which become the bit lines electrically connected to these source-drain regions 40 and 42 are formed on the inter-layer insulating layer 64.

In the peripheral circuit portion, a gate insulating layer 63 is formed on only one surface of the semiconductor layer 76, and the gate electrode 74 for the peripheral circuit is laid on this. Source-drain regions 80 and 82 are formed on the semiconductor layer 76 so as to be located on the two sides of the gate electrode 74, and the portion just beneath of the gate electrode becomes the channel region 78. Interconnection layers 70 and 72 formed on the inter-layer insulating layer 64 are connected to the source-drain regions 80 and 82. The transistor of the peripheral circuit portion is constituted by the usual MOS transistor. Of course, in the transistor of the peripheral circuit portion, it is also possible if the gate insulating film and the gate electrode are formed beneath of the channel region 78 to form a so-called XMOS structure. Where the impurity is not introduced into the channel region, it is rather preferred that the transistor of the peripheral circuit portion be given the XMOS structure.

In the present embodiment, in the memory cell portion, the first gate electrode 36a becomes the electrode for writing the data, and the second gate electrode 38a becomes the electrode for reading the data.

In the present embodiment, the thickness of the semiconductor layer 28 is a thickness of an extent that the field of one surface of the semiconductor layer 28 influences the other surface. The thickness of the semiconductor layer 28 is concretely determined by the above equation (1) or (1'). Where for example the semiconductor layer is made of a silicon single crystal, it is for example about 100 nm or less.

In the present embodiment, the semiconductor layer 76 of the peripheral circuit portion is formed simultaneously with the semiconductor layer 28 of the memory cell portion, and the thicknesses thereof are substantially the same. Further, the gate insulating layer 63 and the gate electrode 74 of the peripheral circuit portion can be formed by the same process as that for the second gate insulating layer 62 and second gate electrode 38a of the memory cell portion.

The equivalent circuit diagram of the memory cell of the non-volatile semiconductor memory device according to the present embodiment has a structure shown in FIG. 5 similar to the third embodiment.

As shown in FIG. 5, the non-volatile semiconductor memory device according to the present embodiment is of the NOR type, in which write word lines W1a, W2a . . . , read word lines W1b, W2b . . . , and pairs of bit lines B1a, B1b; B2a, B2b; . . . are individually connected to respective memory cells M1 . . . M4 . . . in the form of a matrix.

Next, an explanation will be made of an example of the manufacturing process of the non-volatile semiconductor memory device according to the fifth embodiment.

Figure 9A:
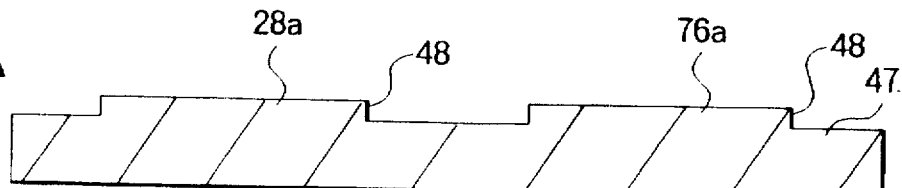
FIG. 9A to FIG. 9F are process diagram showing the manufacturing process of the non-volatile semiconductor memory shown in FIG. 7.

First of all, as shown in FIG. 9A, a step difference 48 is formed on the surface of a semiconductor substrate 47 constituted by a silicon single crystal wafer or the like by using RIE or the like, and semiconductor layer projections 28a and 76a are formed in the form of islands.

Figure 9B:
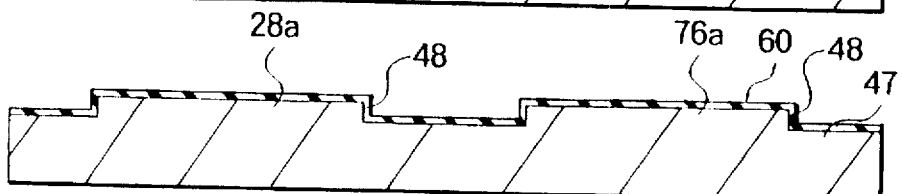
Figure 9C:
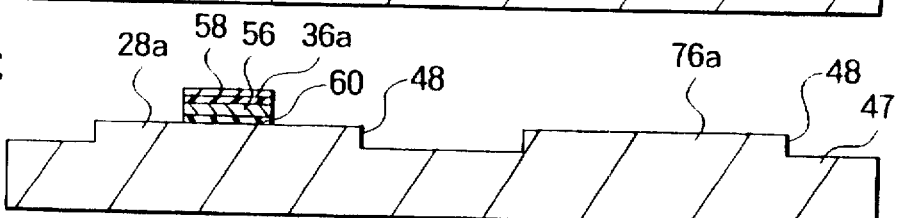

Next, as shown in FIG. 9B, a tunnel insulating layer 60 constituted by a silicon oxide film or the like is formed by using the thermal oxidation method or the like. Next, as shown in FIG. 9C, a gate material layer which becomes the floating gate 56 is formed on the tunnel insulating layer 60, an intermediate insulating layer 58 is formed on this, and the gate material layer acting as the first gate electrode 36a which serves as the control gate is formed on this. Thereafter, patterning is carried out to obtain the floating gate 56 and the first gate electrode 36a. This process is the same as the process of a usual floating gate type memory cell.

As the intermediate insulating layer 58, for example, an ONO film can be adopted. The floating gate 56 is constituted by polycrystalline silicon formed by for example a CVD process. The first gate electrode 36a can be constituted by for example a polycrystalline silicon film or a "polycide" film.

Figure 9D:
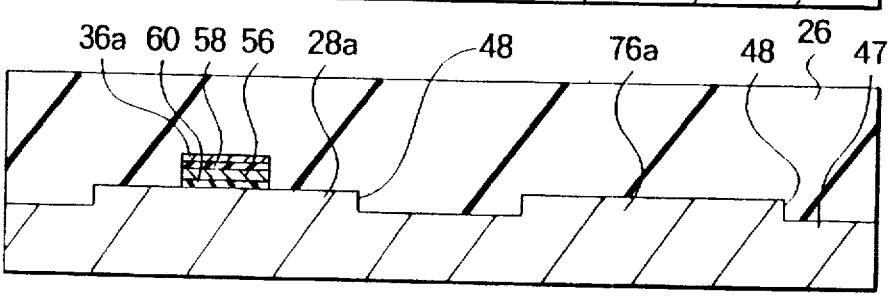

Next, as shown in FIG. 9D, the SOI type insulating layer 26 is formed on the semiconductor substrate 47 on which the first gate electrode 36a is formed. This insulating layer 26 is constituted by silicon oxide formed by for example a CVD process.

Next, the supporting substrate 24 is bonded to the surface of the SOI type insulating layer 26. In actuality, a leveling use polycrystalline silicon layer is deposited on the surface of the insulating layer 26 by CVD or the like and leveled by polishing the surface thereof by CMP or the like, and the supporting substrate 24 constituted by a silicon wafer or the like is bonded to that leveled surface. Namely, the method of forming the SOI structure according to the present embodiment is a so-called bonding SOI method.

Figure 9E:
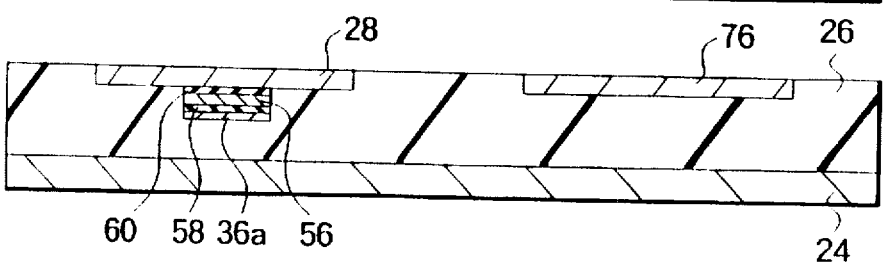

Next, as shown in FIG. 9E, the assembly is turned upside-down from the state shown in FIG. 9D and the surface of the semiconductor substrate 47 is polished by the CMP process or the like until the surface of the insulating layer 26 is exposed. The SOI type semiconductor layers 28 and 76 constituted by the silicon single crystal are left in the part corresponding to the step difference 48 (semiconductor layer projections 28a and 76a). The thickness of the SOI type semiconductor layer 28 left on the SOI type insulating layer 26 is a thickness of an extent that the field of one surface of the semiconductor layer 28 influences the other surface and is for example about 100 nm or less. Where it is intended to change the thickness of the semiconductor layer 28 and the thickness of the semiconductor layer 76, it is sufficient to change the height of the projection 28a and the projection 76a in the step shown in FIG. 9A.

Figure 9F:
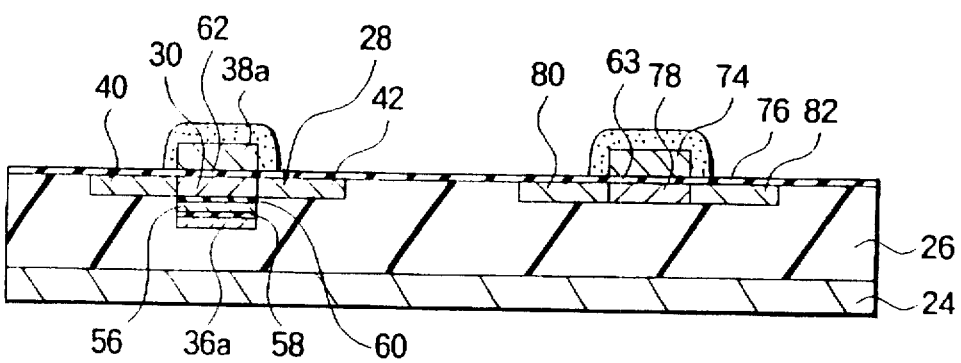

Next, as shown in FIG. 9F, the usual transistor process is used to form a second gate insulating layer 62 and a gate insulating layer 63 for the peripheral circuit portion on the surfaces of the semiconductor layers 28 and 76. A second gate electrode 38a and a gate electrode 74 for the peripheral circuit portion are formed on them, respectively. The second gate insulating layer 62 and the gate insulating layer 63 for the peripheral circuit portion are constituted by silicon oxide formed by for example thermal oxidation and can be simultaneously formed by the same manufacturing process. Further, the second gate electrode 38a and the gate electrode 74 for the peripheral circuit portion are constituted by a polycrystalline silicon film or a "polycide" film etc. formed by for example the CVD process and can be simultaneously formed by the same manufacturing process. Where there also exists a logic circuit portion other than the peripheral circuit portion, the gate insulating layer and gate electrode of the transistor thereof can be simultaneously produced by the same process.

Next, the ion implantation of the impurity is carried out in a self-aligning manner with respect to the second gate electrode 38a and the gate electrode 74 for the peripheral circuit portion to form the source-drain regions 40 and 42 in the semiconductor layer 28 and the source-drain regions 80 and 82 in the semiconductor layer 76. It is also possible to change the conditions of the ion implantation between the memory cell portion and the peripheral circuit portion. The semiconductor layer 28 just beneath of the second gate electrode 38a to which the impurity is not introduced becomes the channel region 30. Further, the channel region 78 is formed in the semiconductor layer 76 just beneath of the gate electrode 74 for the peripheral circuit portion.

Next, as shown in FIG. 8, an inter-layer insulating layer 64 is formed on the SOI structure on which the gate electrodes 38a and 74 are formed, a contact hole is formed in this inter-layer insulating layer 64, and interconnection layers 66, 68, 70, and 72 connected to the source-drain regions 40, 42, 80, and 82 are formed. These interconnection layers are constituted by a polycrystalline silicon interconnection layer, an aluminum interconnection layer, an aluminum alloy interconnection layer, or the like.

By the process as described above, the respective memory cells and peripheral circuits of the non-volatile semiconductor memory device 22b shown in FIG. 8 are produced.

The present embodiment has the same action and effect as those of the third embodiment except the charges are stored in the floating gate 56.

Figure 10:
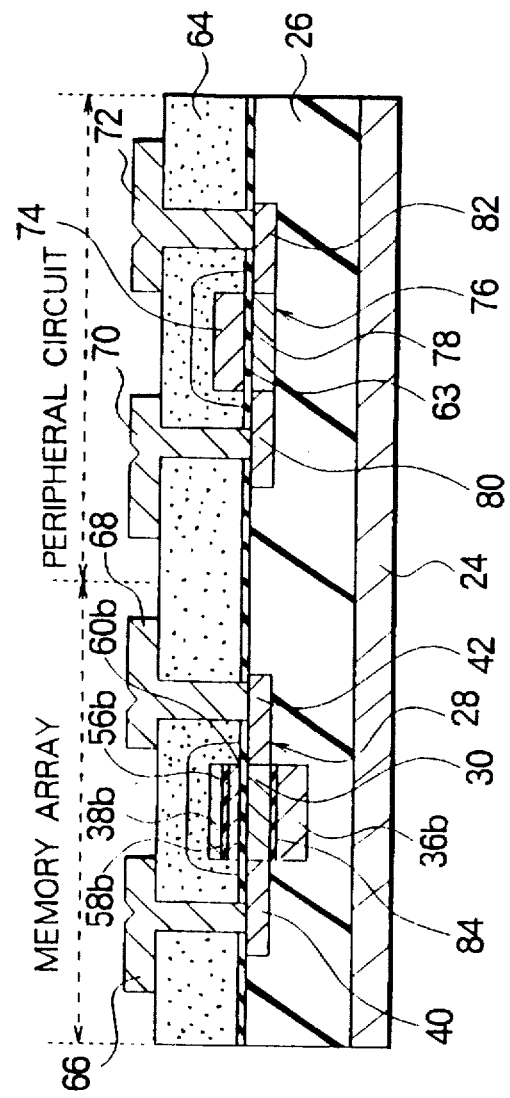
FIG. 10 is a sectional view of the principal parts of the non-volatile memory cell of a sixth embodiment.

In the sixth embodiment of the present invention, as shown in FIG. 10, the non-volatile semiconductor memory device is produced in the same way as the fifth embodiment except that, in the memory cell portion, a gate insulating layer 84 constituted by a single layer of a silicon oxide film or the like is laid between the first gate electrode 36b and the semiconductor layer 28, and an intermediate insulating layer 58b, a floating gate 56b, and a tunnel insulating layer 60b are formed between the second gate electrode 38b and the semiconductor layer 28.

In the present embodiment, the first gate electrode 36b becomes the read gate electrode, and the second gate electrode 38b becomes the write gate electrode.

In the present embodiment, the same action and effect as those by the fifth embodiment can be expected.

Figure 11:
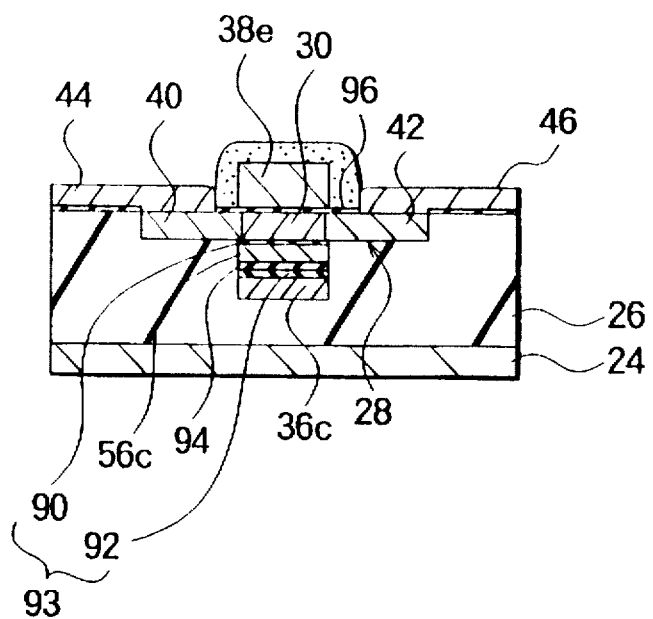
FIG. 11 is a sectional view of the principal parts of the non-volatile memory cell of a seventh embodiment.

In the seventh embodiment of the present invention, as shown in FIG. 11, the non-volatile semiconductor memory device is constituted using a ferroelectric layer 92 and a floating gate 56 and with a so-called XMOS structure as the prerequisite. The non-volatile semiconductor memory device according to the present embodiment is a modification of the non-volatile semiconductor memory device having a floating gate type XMOS structure shown in FIG. 8, where the ferroelectric layer 92 is laid on the intermediate insulating film between the floating gate 56c and the first gate electrode 36c. This will be explained in detail below. Note, explanations of portions common to the above embodiments will be partially omitted.

As shown in FIG. 11, the present embodiment has an SOI structure, in which the SOI type insulating layer 26 is formed on the supporting substrate 24, and the SOI type semiconductor layer 28 is formed on this SOI type insulating layer 26 in the form of an island. On the two sides of the channel region 30 of the semiconductor layer 28, a first gate insulating layer 93 and a second gate insulating layer 96 are laid. Further, a first gate electrode 36c is laid on the first gate insulating layer 93 side and a second gate electrode 38c is laid on the second gate insulating layer 96 side. These are therefore located on the two sides of the channel region 30.

On the two sides of the channel region 30 of the semiconductor layer 28 along the plane direction, the source-drain regions 40 and 42 are formed in a self-aligning manner with respect to the second gate electrode 38c. Further, the interconnection layers 44 and 46 acting as the bit lines electrically connected to these source-drain regions 40 and 42 are formed on the insulating layer 26.

In the present embodiment, an insulating layer 90, a floating gate 56c, a buffer layer 94, and a ferroelectric layer 92 are laid on the first gate insulating layer 93 from the channel region 30 side. This laminate structure located beneath of the channel region 30 is metal-ferroelectric metal-insulator semiconductor (MFMIS) structure. This is a non-volatile memory structure utilizing high speed polarization inversion and residual polarization of the ferroelectric layer 92. The direction of polarization of the ferroelectric layer 92 changes in accordance with the voltage of +V or −V from the first gate electrode 36c, which is the write gate electrode, the charge is generated in the floating gate 56c, and the storage of the data becomes possible.

In the present embodiment, the thickness of the semiconductor layer 28 is a thickness of an extent that the field of one surface of the semiconductor layer 28 influences the other surface. The thickness of the semiconductor layer 28 is concretely determined by the above equation (1) or (1'). Where for example the semiconductor layer is made of a silicon single crystal, it is for example about 100 nm or less.

In the present embodiment, the ferroelectric layer 92 is not particularly limited, but may be constituted by for example PZT (Pb-Zr-Ti-O), PLZT (Pb-La-Zr-Ti-O), $Y_1$ ($SrBi_2Ta_2O_9$), or PT ($PbTiO_3$). The buffer layer 94 is for holding the crystallinity of the ferroelectric layer 92 and does not always have to be provided. As the buffer layer 94, use can be made of a selenium oxide ($SeO_2$) film for PT, a platinum (Pt) film, a ruthenium oxide ($RuO_2$) film, and a two-layer structural film of iridium/iridium oxide ($Tr/IrO_2$) for PZT, PLZT, and $Y_1$, and so on. As the floating gate 56c, for example, a polycrystalline silicon film can be used. As the insulating layer 90, for example, silicon oxide can be used. As the first gate electrode 36c, a polycrystalline silicon film, tungsten film, "polycide" film, Pt film, etc. can be used. As the second gate electrode 38c, a polycrystalline silicon film, "polycide" film, etc. can be used. As the second gate insulating layer 96, silicon oxide etc. can be used.

Note that, in the case where the buffer layer is a conductive film such as platinum or $Ir/IrO_2$, this can be used as the floating gate. In this case, a contamination preventing/bonding layer constituted by TiN or the like is provided between the floating gate 56c and the insulating layer 90. Further, where the floating gate is made of polycrystalline silicon, an alloy-formation preventing layer such as TiN is provided with the buffer layer such as Pt, $IrO_2$, or $RuO_2$.

The present embodiment has the same action and effect as those by the fifth embodiment except the writing and erasing of the data are carried out from the first gate electrode 36c by utilizing the polarization inversion of the ferroelectric layer 92 and the residual polarization thereof. Particularly, in the present embodiment, since the ferroelectric layer is utilized, the write voltage required for the polarization inversion can be set lower than that comprising the floating gate alone. This also contributes to the lowering of the voltage.

Figure 12:
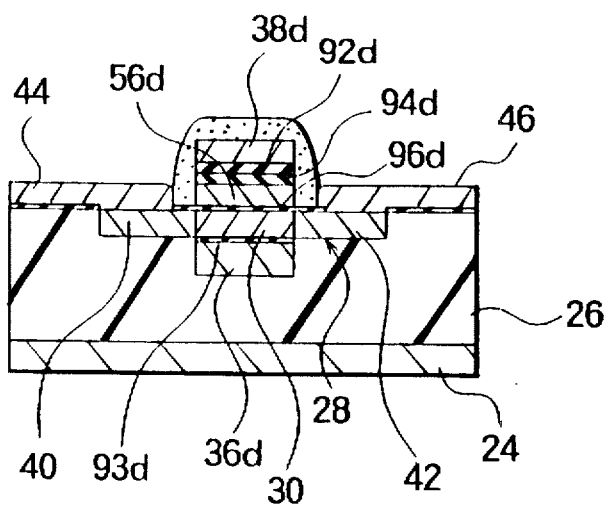
FIG. 12 is a sectional view of the principal parts of the non-volatile memory cell of an eighth embodiment.

As shown in FIG. 12, the eighth embodiment of the present invention is a modification of the embodiment shown in FIG. 11, where the first gate electrode 36d provided the beneath of the channel region 30 becomes the read electrode, and the second gate electrode 38d provided on the channel region 30 becomes the write and erasing electrode. A first gate insulating layer 93d comprised by a single layer is provided between the first gate electrode 36d and the channel region 30, and a ferroelectric layer 92d, a buffer layer 94d, a floating gate 56d, and an insulating layer 96d are provided between the second gate electrode 38d and the channel region 30.

In the present embodiment, the same action and effect as those by the fifth embodiment can be expected.

Figure 13:
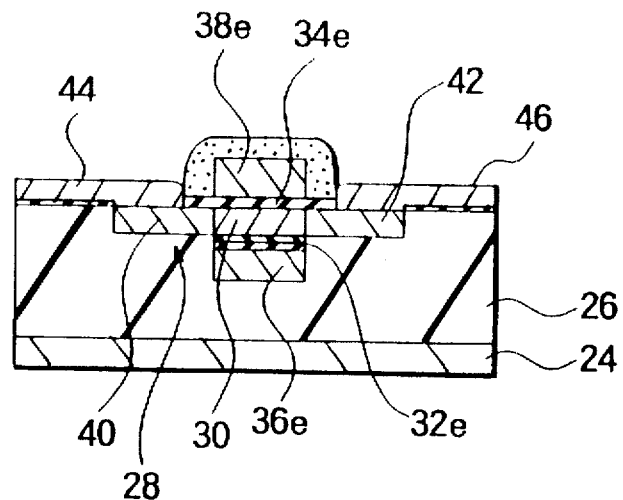
FIG. 13 in a sectional view of the principal parts of the non-volatile memory cell of a ninth embodiment.

In the ninth embodiment of the present invention, as shown in FIG. 13, the non-volatile semiconductor memory device is configured using an ON film, that is, a laminate of a silicon nitride film and a silicon oxide film, as the charge storing layer, and with a so-called XMOS structure as a prerequisite.

The non-volatile semiconductor memory device according to the present embodiment is a modification of the non-volatile semiconductor memory device having a MONOS type XMOS structure shown in FIG. 4, in which the first gate insulating layer 32e made of the ON film is used in place of the ONO film shown in FIG. 4. The ON film has a charge storing function similar to the ONO film. Below, this will be explained in detail. Note, explanations of portions common to the above embodiments will be partially omitted.

As shown in FIG. 13, the present embodiment has an SOI structure, in which the SOI type insulating layer 26 is formed on the supporting substrate 24, and the SOI type semiconductor layer 28 is formed on this SOI type insulating layer 26 in the form of an island. On the two sides of the channel region 30 of the semiconductor layer 28, a first gate insulating layer 32e and a second gate insulating layer 34e are laid. Further, a first gate electrode 36e is laid on the first gate insulating layer 32e side and a second gate electrode 38e is laid on the second gate insulating layer 34e side. These are therefore located on the two sides of the channel region 30.

On the two sides of the channel region 30 of the semiconductor layer 28 along the plane direction, the source-drain regions 40 and 42 are formed in a self-aligning manner with respect to the second gate electrode 38c. Further, the interconnection layers 44 and 46 acting as the bit lines electrically connected to these source-drain regions 40 and 42 are formed on the insulating layer 26.

In the present embodiment, the first gate insulating layer 32e located beneath of the channel region 30 is constituted by an ON film having a charge storing function. The rest of the structure is similar to that of the embodiment shown in FIG. 4.

The present embodiment has the same action and effect as those by the first embodiment shown in FIG. 4.

Figure 14:
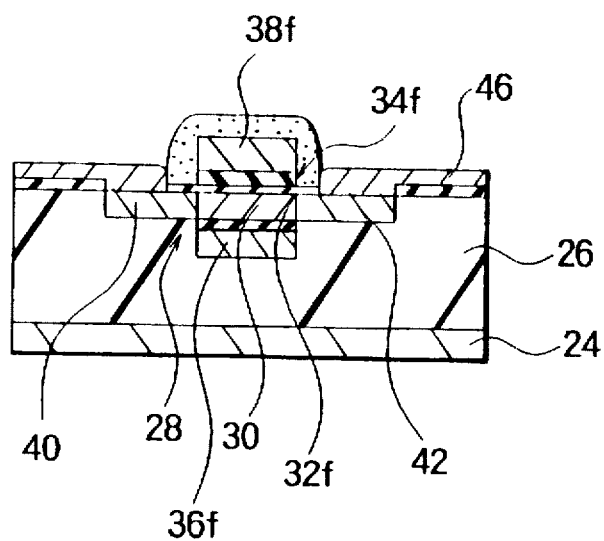
FIG. 14 is a sectional view of the principal parts of the non-volatile memory cell of a 10th embodiment.

As shown in FIG. 14, the 10th embodiment of the present invention is a modification of the embodiment shown in FIG. 13, in which the first gate electrode 36f provided beneath of the channel region 30 becomes the read electrode, and the second gate electrode 38f provided on the channel region 30 becomes the write and erasing electrode. A first gate insulating layer 32f comprised of a single layer is provided between the first gate electrode 36f and the channel region 30, and a second gate insulating film 34f made of an ON film is provided between the second gate electrode 38f and the channel region 30.

In the present embodiment, the same action and effect as those by the fourth embodiment can be expected.

The 11th embodiment of the present invention is a modification of the third to 10th embodiments. It is an embodiment wherein the SOI structure is formed by a method other than the bonding method.

Figure 15:
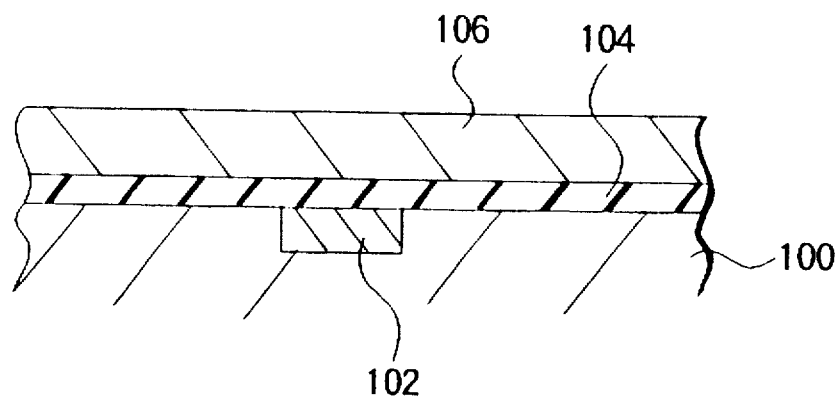
FIG. 15 is a sectional view of the principal parts of the non-volatile memory cell of an 11th embodiment.

As shown in FIG. 15, in the present embodiment, the ion implantation is carried out in a predetermined pattern so that the peak of the n-type or p-type impurity concentration comes at the position of a predetermined depth from the surface of a semiconductor substrate 100 constituted by a silicon single crystal wafer or the like so as to form a first gate electrode 102. Thereafter, the ion implantation of $O_2$ is carried out for the entire surface so that the peak of concentration is obtained at a depth located on the gate electrode 102, thereby forming an SOI type insulating layer 104.

For this reason, a semiconductor layer 106 constituted by a silicon single crystal is formed on the insulating layer 104. By utilizing this semiconductor layer, a non-volatile semiconductor memory device utilizing an XMOS structure according to the third to tenth embodiments may be formed.

In the present embodiment as well, a memory cell structure of the non-volatile semiconductor memory device disclosed in any one of the third to tenth embodiments can be realized. In addition, the manufacturing process thereof is easier than the bonding SOI method.

Figure 16:
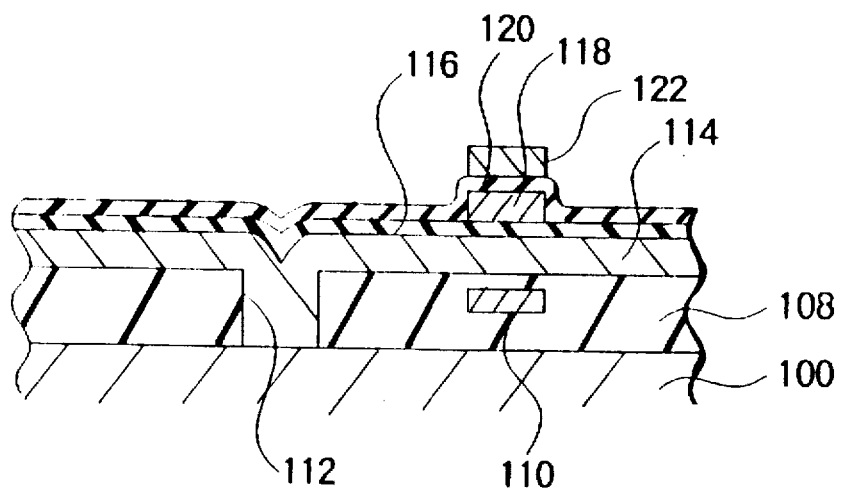
FIG. 16 is a sectional view of the principal parts of the non-volatile memory cell of a 12th embodiment.

The 12th embodiment of the present invention is a modification of the third to 10th embodiments. It is an embodiment for obtaining a SOI structure by a method other than the bonding method as shown in FIG. 16.

An insulating layer 108 in which a first gate electrode 110 is buried in a predetermined pattern is formed on a semiconductor substrate 100 constituted by a silicon single crystal wafer or the like. A contact hole 112 exposed at the surface of the semiconductor substrate 100 is formed in the insulating layer 108. Thereafter, an amorphous silicon film is grown by a CVD process, and a semiconductor layer 114 is crystallized from the bottom portion of the contact hole 112 by using the lateral solid phase epitaxial technique.

Next, on the semiconductor layer 114, a gate insulating layer 116 constituting the second gate insulating layer, a floating gate 118, an intermediate insulating layer 120, and a second gate electrode 122 are formed. The materials of the gate electrode, the floating gate, and the insulating layer are the same as those of the above embodiments.

In the present embodiment, the memory cell structure of the non-volatile semiconductor memory device disclosed in any of the third to tenth embodiments can be realized. In addition, the manufacturing process thereof is easier than the bonding SOI method.

Note that, in the above embodiments, the memory cell structure of the non-volatile semiconductor memory device was made the NOR type, but the present invention can be applied also to a NAND type.

Below, an explanation will be made of some embodiments of a non-volatile semiconductor memory device of a NAND type to which the present invention is applied.

In the 13th embodiment of the present invention, similar to the third embodiment, the NAND type non-volatile semiconductor memory device is constituted by using the ONO film as the charge storing layer and utilizing the so-called XMOS structure.

Figure 17:
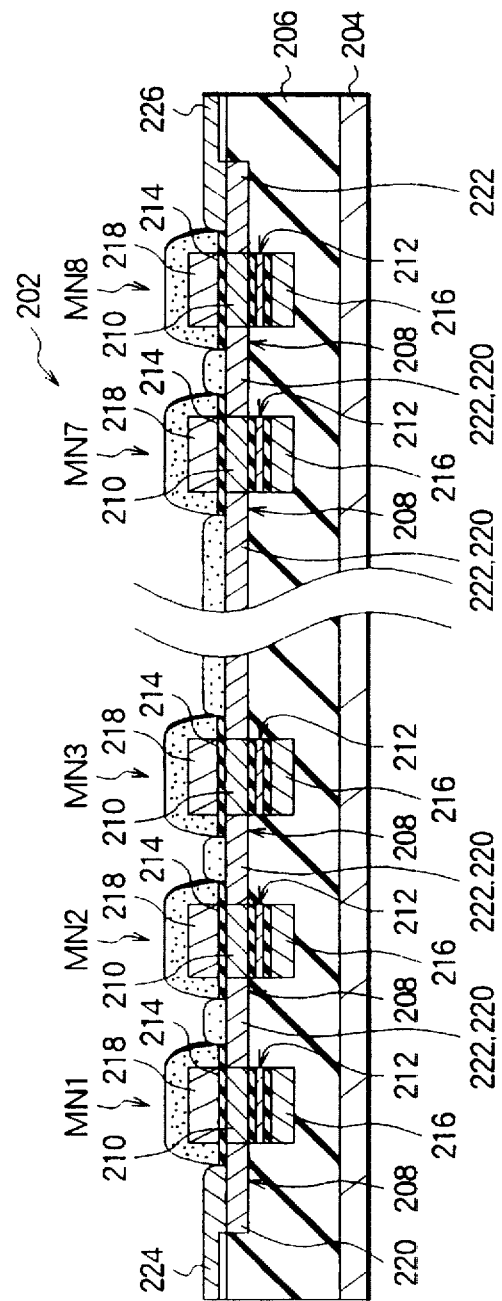
FIG. 17 is a sectional view of the principal parts of the non-volatile memory cell of a 13th embodiment.

A sectional view of the principal parts of one memory cell in the non-volatile semiconductor memory device according to the present embodiment will be shown in FIG. 17.

As shown in FIG. 17, a non-volatile semiconductor memory device 202 according to the present embodiment has an SOI structure, in which an SOI type insulating layer 206 is formed on a supporting substrate 204, and a plurality (eight in the present embodiment) of SOI type semiconductor layers 208 are formed on this SOI type insulating layer 206 in a connected state. On the two sides of the channel region 210 of each semiconductor layer 208, a first gate insulating layer 212 and a second gate insulating layer 214 are laid. Further, a first gate electrode 216 is laid on the first gate insulating layer 212 side and a second gate electrode 218 is laid on the second gate insulating layer 214 side. These are therefore located on the two sides of the channel region 210.

On the two sides of the channel region 210 of the semiconductor layer 208 along the plane direction, the source-drain regions 220 and 222 are formed in a self-aligning manner with respect to the second gate electrode 218. Further, the interconnection layers 224 and 226 acting as the bit lines electrically connected to these source-drain regions 220 and 222 are formed on the insulating layer 206. Note that, the structure is one wherein the source-drain regions 220 and 222 between adjoining memory cells are commonly used (connected in series), and respective channel regions 210 are connected.

In the present embodiment, the first gate insulating layer 212 is constituted by an ONO film (three-layer film of a silicon oxide film, a silicon nitride film, and another silicon oxide film) and constitutes the charge storing layer. The first gate electrode 216 becomes the electrode for writing the data (also for erasing the data; the same is true also for the following), and the second gate electrode 218 becomes the electrode for reading the data.

In the present embodiment, the thickness of the semiconductor layer 208 is a thickness of an extent that the field of one surface of the semiconductor layer 208 influences the other surface. The thickness of the semiconductor layer 208 is concretely determined by the above equation (1) or (1'). Where for example the semiconductor layer is a silicon single crystal and the impurity concentration of the channel region is $10^{17}/cm^3$ or more, it is for example about 100 nm or less.

Figure 18:
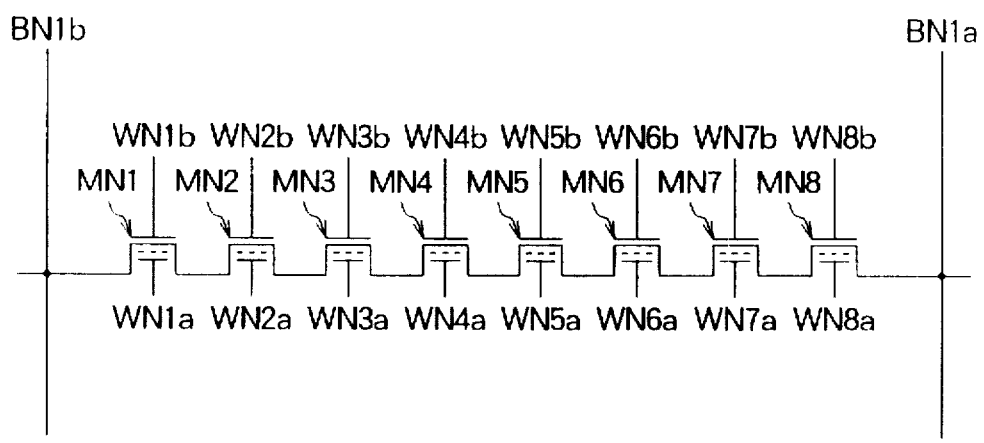
FIG. 18 is an equivalent circuit diagram of the non-volatile semiconductor memory shown in FIG. 17.

An equivalent circuit diagram of the memory cell of the non-volatile semiconductor memory device according to the present embodiment will be shown in FIG. 18. As shown in FIG. 18, in the non-volatile semiconductor memory device according to the present embodiment, write word lines WN1a, WN2a . . . , MN8a, and read word lines WN1b, WN2b . . . , MN8b are individually connected to respective memory cells MN1 . . . MN8 . . . , and a bit line BN1a is connected to the memory cell MN8 and a bit line BN1b is connected to the memory cell MN1.

The manufacturing process of the non-volatile semiconductor memory device according to the present embodiment is substantially the same as that of the third embodiment, except that each memory cell of the non-volatile semiconductor memory device 22 shown in FIG. 17 is produced only by changing the mask for forming the step difference on the surface of the semiconductor substrate constituted by the silicon single crystal wafer or the like, interconnections, and mask for the contacts.

In the non-volatile semiconductor memory device according to the present embodiment, as shown in FIG. 18, where writing/erasing data, the write voltage is applied to the first gate electrode 216 for writing through the write word lines WN1a, WN2a, . . . , WN8a. This write voltage is not particularly limited, but is for example 5 to 9V. By the application of this write voltage, the charges are stored in the ONO film of the first gate insulating layer 212 constituting the charge storing layer. The field by these stored charges influences the surface of the second gate insulating layer 214 of the semiconductor layer 208.

For this reason, at the time of reading the data, by applying the read voltage to the third gate electrode 218 for reading shown in FIG. 17 through the read word lines WN1b, WN2b, . . . , WN8b shown in FIG. 18, the stored data can be read out. The read voltage is not particularly limited, but is for example 0.7V.

As mentioned before, in the structure of the non-volatile semiconductor memory device of the related art, the read electrode and the write electrode were the same, therefore there was a large possibility of occurrence of erroneous writing (reading disturbances) in the non-selected cells at the time of reading of the data. In the present embodiment, the electrode for writing and the electrode for reading are different, so the inconvenience of reading disturbances etc. can be effectively prevented.

Further, the thickness of the second gate insulating layer 214 beneath of the second gate electrode 218 which becomes the read electrode is made process compatible with the peripheral transistors, therefore it can be constituted relatively thick to about 6 to 8 nm without considering the write voltage. Conversely the thickness of the silicon oxide film in the first gate insulating layer 212 can be made thin to about 4 nm so as to reduce the write voltage.

Further, in the present embodiment, a so-called XMOS structure is adopted where the first gate electrode 216 and the second gate electrode 218 are laid at the two sides of the channel region 210 of the semiconductor layer 208 via the first gate insulating layer 212 and the second gate insulating layer 214, respectively. For this reason, the threshold voltage can be controlled by the relationship of the work functions with the first gate electrode 216, the second gate electrode 218, and the channel region 210 without being influenced by the statistical fluctuation of the channel impurity concentration. Therefore, miniaturization is possible even after the 0.1 μm generation—which has been said to be the limit of miniaturization of the related art of bulk MOS transistors.

Furthermore, in the present embodiment, it is possible to fabricate the second gate insulating layer 214 and the second gate electrode 218 in the same manner as the process for fabricating the other circuits such as the peripheral circuits. For this reason, there is a high process compatibility also with the circuits other than the memory cell portion.

Figure 19:
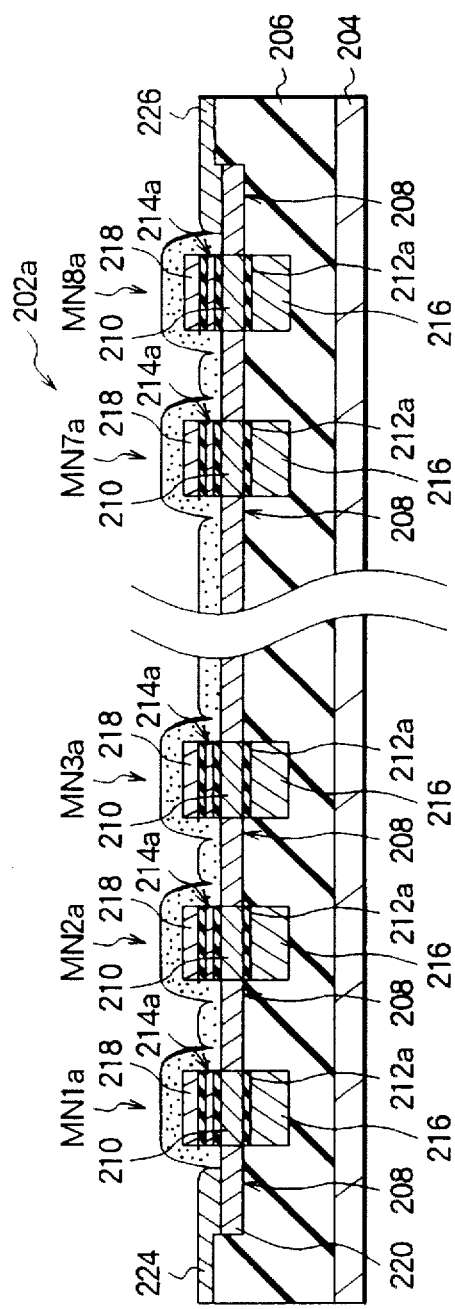
FIG. 19 is a sectional view of the principal parts of the non-volatile memory cell of a 14th embodiment.

In the 14th embodiment of the present invention, as shown in FIG. 19, a non-volatile semiconductor memory device 202a is produced in the same way as that for the 13th embodiment except that a first gate insulating layer 212a is constituted by a film comprised of a single layer not having a charge storing function such as a silicon oxide film, and a second gate insulating layer 214a is constituted by a charge storing layer such as an ONO film.

In the present embodiment, the first gate electrode 216 becomes the read gate electrode and the second gate electrode 218 becomes the write gate electrode.

In the present embodiment, the same action and effect as those by the 13th embodiment can be expected.

Figure 20:
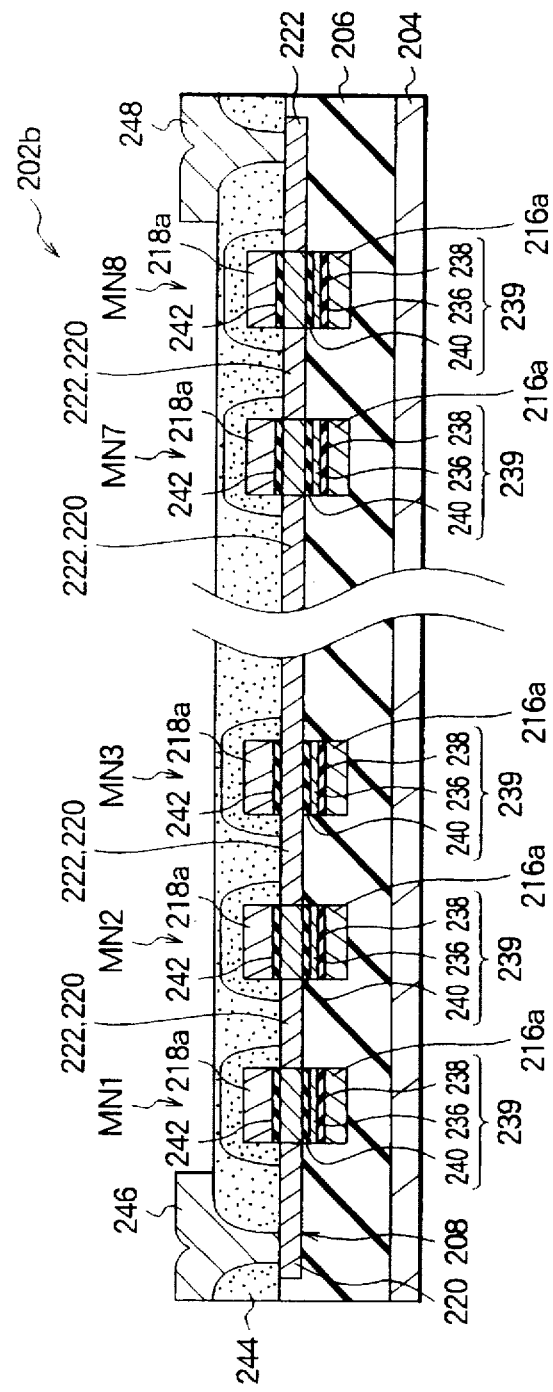
FIG. 20 is a sectional view of the principal parts of the non-volatile memory cell of a 15th embodiment.

In the 15th embodiment of the present invention, as shown in FIG. 20, a NAND type non-volatile semiconductor memory device is configured by using a floating gate 236 as the charge storing layer and using an XMOS structure as a prerequisite.

As shown in FIG. 20, the non-volatile semiconductor memory device 202b according to the present embodiment has an SOI structure, in which an SOI type insulating layer 206 is formed on the supporting substrate 204, and an SOI type semiconductor layer 208 is formed on this SOI type insulating layer 206 in a connected state. On the two sides of the channel region 210 of each semiconductor layer 208, a first gate insulating layer 239 and a second gate insulating layer 242 are laid. Further, a first gate electrode 216a is laid on the first gate insulating layer 239 side, and a second gate electrode 218a is laid on the second gate insulating layer 242 side. These are therefore located on the two sides of the channel region 210.

The first gate insulating layer 239 comprises an inter-layer insulating layer 238 and a tunnel insulating layer 240. A floating gate 236 is interposed between these films 238 and 240. In the present embodiment, the floating gate 236 becomes the charge storing layer.

On the two sides of the channel region 210 of the semiconductor layer 208 along the plane direction, the source-drain regions 220 and 222 are formed in a self-aligning manner with respect to the second gate electrode 218. Further, the interconnection layers 246 and 248 acting as the bit lines electrically connected to these source-drain regions 220 and 222 are formed on the inter-layer insulating layer 244. Note that, the structure is one wherein the source-drain regions 220 and 222 between adjoining memory cells are commonly used (connected in series), and respective channel regions 210 are connected.

In the present embodiment, in the memory cell portion, the first gate electrode 216a becomes the electrode for writing the data, and the second gate electrode 218a becomes the electrode for reading the data.

In the present embodiment, the thickness of the semiconductor layer 208 is a thickness of an extent that the field of one surface of the semiconductor layer 208 influences the other surface. The thickness of the semiconductor layer 208 is concretely determined by the above equation (1) or (1') and is for example about 100 nm or less where the semiconductor layer is made of a silicon single crystal.

An equivalent circuit diagram of the memory cell of the non-volatile semiconductor memory device according to the present embodiment exhibits the structure shown in FIG. 18 similar to the 13th embodiment.

The manufacturing process of the non-volatile semiconductor memory device according to the present invention is substantially the same as that of the third embodiment except the step of manufacturing the peripheral circuit portion. Each memory cell of the non-volatile semiconductor memory device 202b shown in FIG. 20 is produced only by changing the mask for forming the step difference on the surface of the semiconductor substrate constituted by the silicon single crystal wafer or the like, interconnections, and the mask for the contacts.

The present embodiment has the same action and effect as those by the 13th embodiment except the charges are stored in the floating gate 236.

Figure 21:
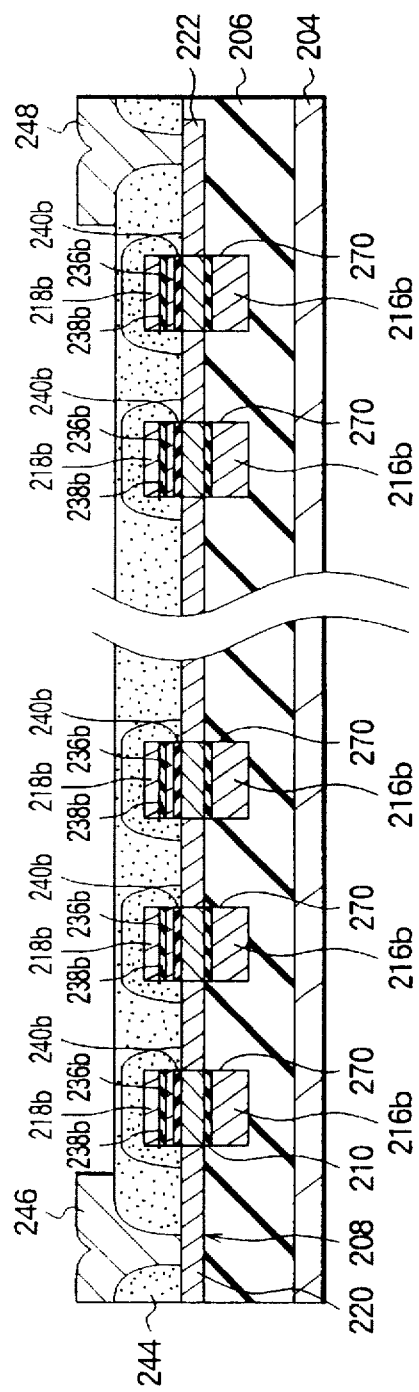
FIG. 21 is a sectional view of the principal parts of the non-volatile memory cell of a 16th embodiment.

In the 16th embodiment of the present invention, as shown in FIG. 21, the non-volatile semiconductor memory device is produced in the same way as the 15th embodiment except that a gate insulating layer 270 constituted by a silicon oxide film comprised by a single layer or the like is laid between the first gate electrode 216b and the semiconductor layer 208, and an inter-layer insulating layer 238b, a floating gate 236b, and a tunnel insulating layer 240b are formed between the second gate electrode 218b and the semiconductor layer 208.

In the present embodiment, the first gate electrode 216b becomes the read gate electrode, and the second gate electrode 218b becomes the write gate electrode.

In the present embodiment, same action and effect as those by the 15th embodiment can be expected.

Figure 22:
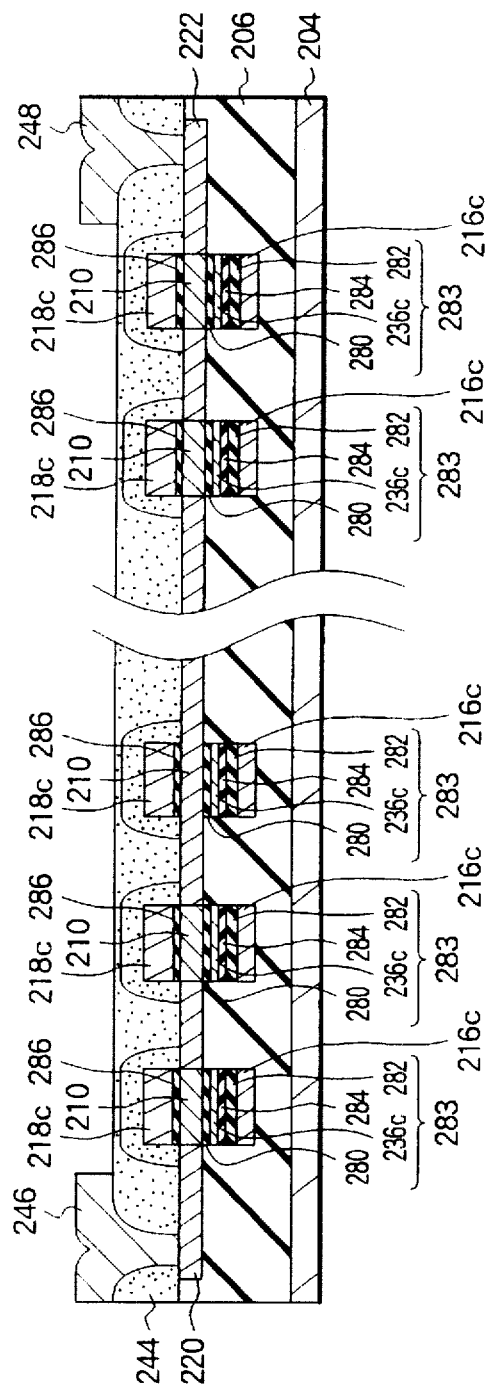
FIG. 22 is a sectional view of the principal parts of the non-volatile memory cell of a 17th embodiment.

In the 17th embodiment of the present invention, as shown in FIG. 22, the non-volatile semiconductor memory device is configured by using a ferroelectric layer 282 and a floating gate 236 and with a so-called XMOS structure as a prerequisite. The non-volatile semiconductor memory device according to the present embodiment is a modification of the non-volatile semiconductor memory device having a floating gate type XMOS structure shown in FIG. 19, wherein the ferroelectric layer 282 is laid on the inter-layer insulating film between the floating gate 236c and the first gate electrode 216c. This will be explained in detail below. Note, explanations of portions common to the above embodiments will be partially omitted.

As shown in FIG. 22, the present embodiment has an SOI structure, in which an SOI type insulating layer 206 is formed on the supporting substrate 204, and an SOI type semiconductor layer 208 is formed on this SOI type insulating layer 206 in a connected state. On the two sides of the channel region 210 of the semiconductor layer 208, a first gate insulating layer 283 and a second gate insulating layer 286 are laid. Further, a first gate electrode 216c is laid on the first gate insulating layer 283 side and a second gate electrode 218c is laid on the second gate insulating layer 286 side. These are therefore located on the two sides of the channel region 210.

On the two sides of the channel region 210 of the semiconductor layer 208 along the plane direction, the source-drain regions 220 and 222 are formed in a self-aligning manner with respect to the second gate electrode 218c. Further, the interconnection layers 246 and 248 acting as the bit lines electrically connected to these source-drain regions 220 and 222 are formed on the inter-layer insulating layer 244. Note that, the structure is one wherein the source-drain regions 220 and 222 between adjoining memory cells are commonly used (connected in series), and respective channel regions 210 are connected.

In the present embodiment, an insulating layer 280, a floating gate 236c, a buffer layer 284, and a ferroelectric layer 282 are laid on the first gate insulating layer 283 from the channel region 210 side. This laminate structure located beneath of the channel region 210 is the MFMIS structure mentioned before. It is a non-volatile memory structure utilizing the high speed polarization inversion and residual polarization of the ferroelectric layer 282. In the floating gate 236c, the direction of polarization of the ferroelectric layer 282 changes in accordance with the voltage of +V or −V from the first gate electrode 216c which serves as the gate electrode for writing, the charge is generated in the floating gate 236c, and the storage of the data becomes possible.

In the present embodiment, the thickness of the semiconductor layer 208 is a thickness of an extent that the field of one surface of the semiconductor layer 208 influences the other surface. The thickness of the semiconductor layer 208 is concretely determined by the above equation (1) or (1'). Where for example the semiconductor layer is made of a silicon single crystal, it is for example about 100 nm or less.

In the present embodiment, the ferroelectric layer 282 is not particularly limited, but similar to the seventh embodiment, it is constituted by for example PZT (Pb-Zr-Ti-O), PLZT (Pb-La-Zr-Ti-O), $Y_1$ ($SrBi_2Ta_2\ O_9$), or PT ($PbTiO_3$). The buffer layer 284 is for holding the crystallinity of the ferroelectric layer 282 and does not always have to be provided. As the buffer layer 284, use can be made of a selenium oxide ($SeO_2$) film for PT, a platinum (Pt) film, a ruthenium oxide ($RUO_2$) film, and a two-layer structural film of iridium/iridium oxide ($Ir/IrO_2$) for the PZT, PLZT, and $Y_1$, and so on. As the floating gate 236c, for example, a polycrystalline silicon film can be used. As the insulating layer 280, for example, silicon oxide can be used. As the first gate electrode 216c, a polycrystalline silicon film, tungsten film, "polycide" film, Pt film, etc. can be used. As the second gate electrode 218c, a polycrystalline silicon film, "polycide" film, etc. can be used. As the second gate insulating layer 216, silicon oxide etc. can be used.

Note that, in the case where the buffer layer is a conductive film such as platinum or $Ir/IrO_2$, this can be used as the floating gate. In this case, a contamination preventing/bonding layer constituted by TiN or the like is provided between the floating gate 236c and the insulating layer 280. Further, where the floating gate is made of polycrystalline silicon, an alloy-formation preventing layer such as TiN is provided with the buffer layer such as Pt, $IrO_2$, or $RuO_2$.

The present embodiment has the same action and effect as those by the 11th embodiment except the writing and erasing of the data are carried out from the first gate electrode 216c by utilizing the polarization inversion of the ferroelectric layer 282 and the residual polarization thereof. Particularly, since the present embodiment utilizes the ferroelectric layer, the write voltage required for the polarization inversion can be set lower than that comprising the floating gate alone. This also contributes to the lowering of voltage.

Figure 23:
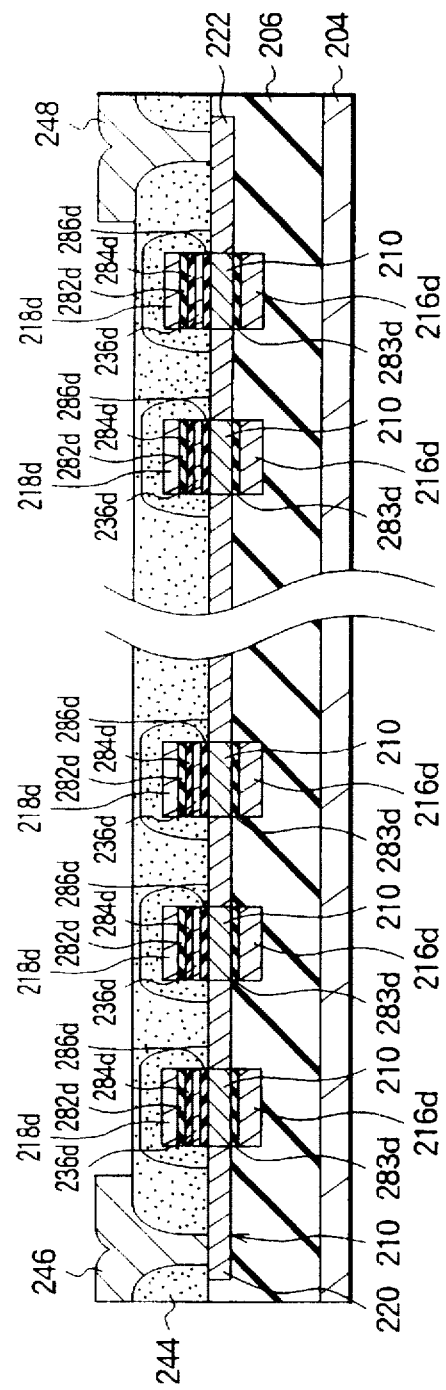
FIG. 23 is a sectional view of the principal parts of the non-volatile memory cell of an 18th embodiment.

As shown in FIG. 23, the 18th embodiment of the present invention is a modification of the embodiment shown in FIG. 22, in which the first gate electrode 216d provided beneath of the channel region 210 becomes the read electrode, and the second gate electrode 218d provided on the channel region 210 becomes the write and erasing electrode. A first gate insulating layer 283d comprised of a single layer is provided between the first gate electrode 216d and the channel region 210, and a ferroelectric layer 282d, a buffer layer 284d, a floating gate 236d, and an insulating layer 286d are provided between the second gate electrode 218d and the channel region 210.

In the present embodiment, the same action and effect as those by the 17th embodiment can be expected.

Figure 24:
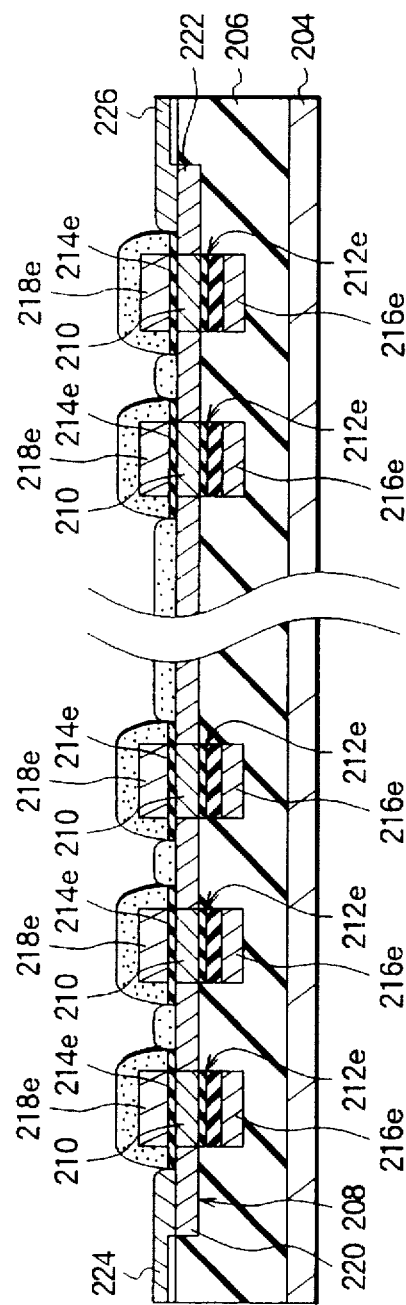
FIG. 24 is a sectional view of the principal parts of the non-volatile memory cell of a 19th embodiment.

In the 19th embodiment of the present invention, as shown in FIG. 24, the non-volatile semiconductor memory device is configured using an ON film, that is, a laminate film of a silicon nitride film and a silicon oxide film, as the charge storing layer, and with a so-called XMOS structure as a prerequisite. The non-volatile semiconductor memory device according to the present embodiment is a modification of the non-volatile semiconductor memory device having a MONOS type XMOS structure shown in FIG. 17 in which the first gate insulating layer 212e made of the ON film is used in place of the ONO film shown in FIG. 17. The ON film has the charge storing function similar to the ONO film. Below, this will be explained in detail. Note, explanations of portions common to the above embodiments will be partially omitted.

As shown in FIG. 24, the present embodiment has an SOI structure, in which an SOI type insulating layer 206 is formed on the supporting substrate 204, and an SOI type semiconductor layer 208 is formed on this SOI type insulating layer 206 in a connected state. On the two sides of the channel region 210 of the semiconductor layer 208, a first gate insulating layer 212e and a second gate insulating layer 214e are laid. Further, a first gate electrode 216e is laid on the first gate insulating layer 212e side and a second gate electrode 218e is laid on the second gate insulating layer 214e side. These are therefore located on the two sides of the channel region 210.

On the two sides of the channel region 210 of the semiconductor layer 208 along the plane direction, the source-drain regions 220 and 222 are formed in a self-aligning manner with respect to the second gate electrode 218c. Further, the interconnection layers 224 and 226 acting as the bit lines electrically connected to these source-drain regions 220 and 222 are formed on the insulating layer 206. Note that, the structure is one wherein the source-drain regions 220 and 222 between adjoining memory cells are commonly used (connected in series), and respective channel regions 210 are connected.

In the present embodiment, the first gate insulating layer 212e located beneath of the channel region 210 is constituted by an ON film having the charge storing function. The rest of the configuration is similar to that of the embodiment shown in FIG. 17.

The present embodiment has the same action and effect as those by the 13th embodiment shown in FIG. 17.

Figure 25:
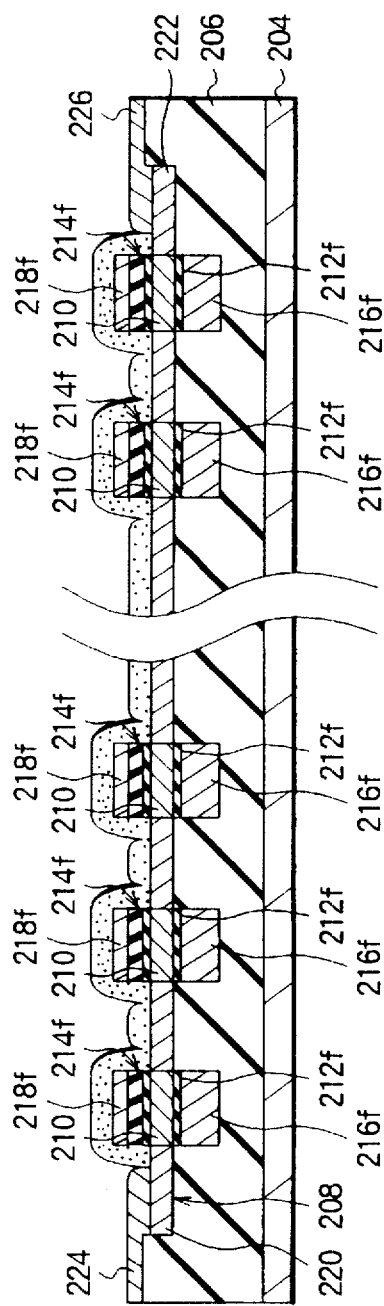
FIG. 25 is a sectional view of the principal parts of the non-volatile memory cell of a 20th embodiment.

As shown in FIG. 25, the 20th embodiment of the present invention is a modification of the embodiment shown in FIG. 24 in which the first gate electrode 216f provided beneath of the channel region 210 becomes the read electrode, and the second gate electrode 218f provided on the channel region 210 becomes the write and erasing electrode. A first gate insulating layer 212f comprised of a single layer is provided between the first gate electrode 216f and the channel region 210, and a second gate insulating film 214f made of an ON film is provided between the second gate electrode 218f and the channel region 210.

In the present embodiment, the same action and effect as those by the 14th embodiment can be expected.

The 21st embodiment of the present invention is a modification of the third to 20th embodiments. It is an embodiment where the electrode for draining the charges out of the semiconductor layer 28 (hereinafter referred to as the draining electrode) is provided. Here, an explanation will be made of the configuration and manufacturing process thereof in comparison with the third embodiment.

Figure 26A:
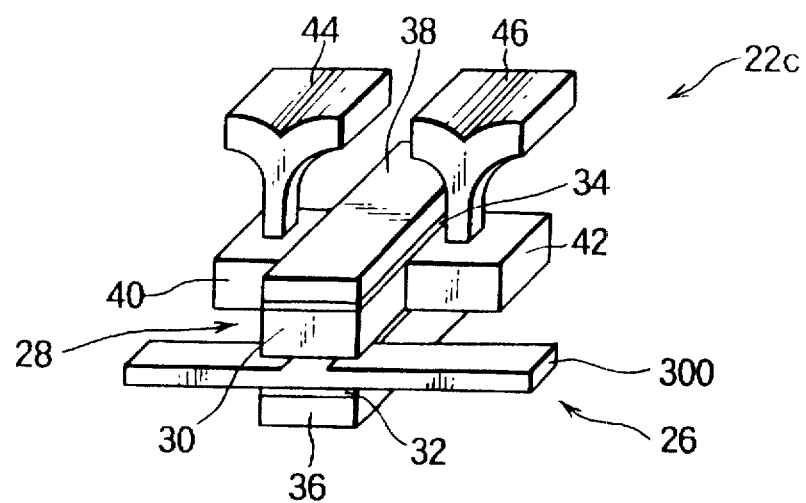
FIG. 26A is a view schematically showing the non-volatile memory cell of a 21st embodiment by a perspective view.
Figures 26B, 26C:
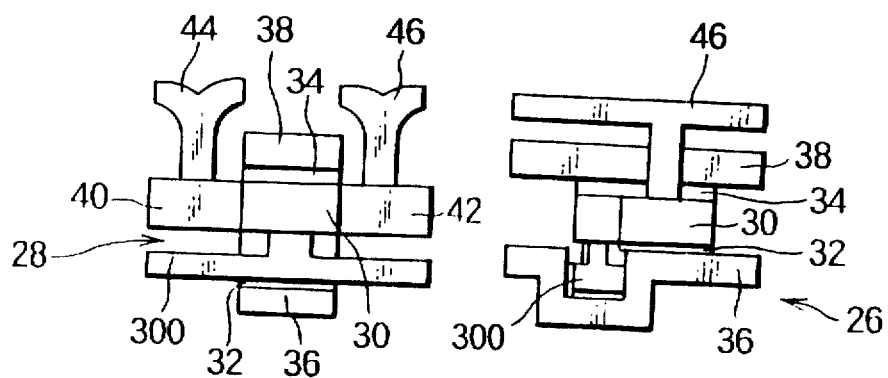
FIG. 26B is a view of the non-volatile memory cell of FIG. 26A seen from the front.
FIG. 26C is a view of the non-volatile memory cell of FIG. 26A seen from the side.

FIG. 26A schematically shows by a perspective view the structure of one memory cell where the draining electrode is formed with respect to a NOR type non-volatile semiconductor memory device having an XMONOS structure having an ONO film as the charge storing layer. FIG. 26B is a view of the cell of FIG. 26A seen from the front, and FIG. 26C is a view of the cell of FIG. 26A seen from the side.

As shown in FIGS. 26A to 26C, the non-volatile semiconductor memory device 22c according to the present embodiment has an SOI structure, in which an SOI type insulating layer 26 is formed on the supporting substrate (24), and SOI type semiconductor layers 28 are formed on this SOI type insulating layer 26 in the form of islands at predetermined intervals. A draining electrode 300 for draining charges existing in the semiconductor layer 28 partially connected to the negative side of the semiconductor layer 28 is formed in the SOI insulating layer 26.

On the two sides of the channel region 30 of the semiconductor layer 28, a first gate insulating layer 32 and a second gate insulating layer 34 are laid. Further, a first gate electrode 36 is laid on the first gate insulating layer 32 side and a second gate electrode 38 is laid on the second gate insulating layer 34 side. These are therefore located on the two sides of the channel region 30.

On the two sides of the channel region 30 of the semiconductor layer 28 along the plane direction, the source-drain regions 40 and 42 are formed in a self-aligning manner with respect to the second gate electrode 38. Further, the interconnection layers 44 and 46 acting as the bit lines electrically connected to these source-drain regions 40 and 42 are formed on the insulating layer 26.

In the present embodiment, since the draining electrode 300 for draining the charges existing in the semiconductor layer 28 is provided, the potential of the semiconductor layer 28 can be kept, whereby uniform circuit operation is guaranteed.

Note that, in the present embodiment, the first gate insulating layer 32 is constituted by an ONO film (three-layer film of a silicon oxide film, a silicon nitride film, and another silicon oxide film) and constitutes the charge storing layer. The first gate electrode 36 becomes the electrode for writing the data (also for erasing the data, same true also for the following), and the second gate electrode 38 becomes the electrode for reading the data.

Also, in the present embodiment, the thickness of the semiconductor layer 28 is a thickness of an extent that the field of one surface of the semiconductor layer 28 influences the other surface. The thickness of the semiconductor layer 28 is concretely determined by the above equation (1) or (1'). Where for example the semiconductor layer is a silicon single crystal and the impurity concentration of the channel region is $10^{17}/cm^3$ or more, it is for example about 100 nm or less.

Next, an explanation will be made of one example of the method of producing the non-volatile semiconductor memory device according to the present embodiment.

Figure 27A:
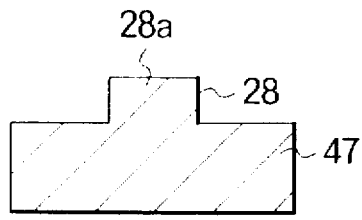
FIGS. 27A to 27J are views showing the manufacturing process of the non-volatile memory cell of the 21st embodiment by front views.
Figure 28A:
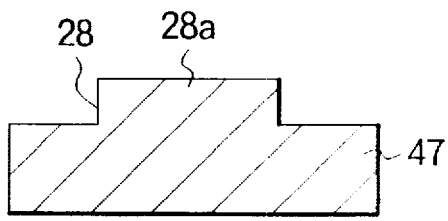
FIGS. 28A to 28J are views showing the manufacturing process of the non-volatile memory cell of the 21st embodiment by front views.

First of all, as shown in FIG. 27A and FIG. 28A, the step difference 48 is formed on the surface of the semiconductor substrate 47 constituted by the silicon single crystal wafer or the like by using RIE or the like, and the semiconductor layer use projections 28a are formed in the form of islands.

Figure 27B:
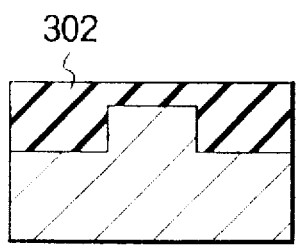
Figure 28B:
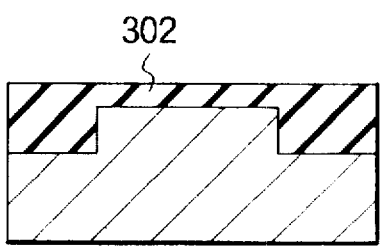

Next, as shown in FIG. 27B and FIG. 28B, the silicon oxide film 302 is formed by using the thermal oxidation method or the like, and a contact hole 302a reaching one part of one surface of the step difference 48 is formed in this silicon oxide film 302.

Figure 27C:
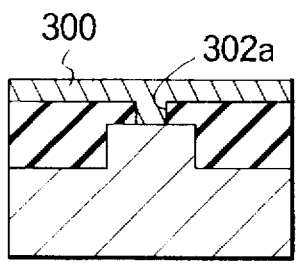
Figure 28C:
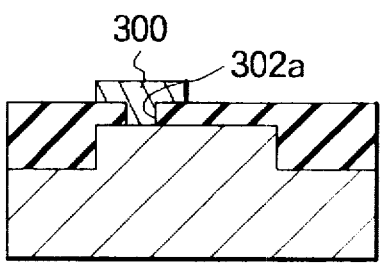

Thereafter, as shown in FIG. 27C and FIG. 28C, the electrode material is deposited in the contact hole 302a and on the silicon oxide film 302 and patterning is carried out by etching by using a mask to form the draining electrode 300.

Figure 27D:
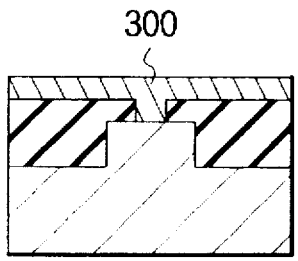
Figure 28D:
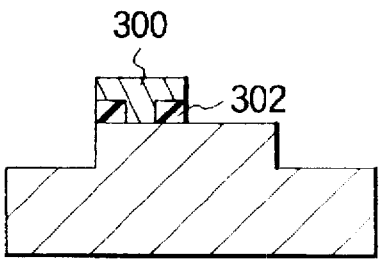

Next, as shown in FIG. 27D and FIG. 28D, the silicon oxide film 302 of the portion other than the portion just beneath of the drawing electrode 300 is removed by using the same mask.

Figure 27E:
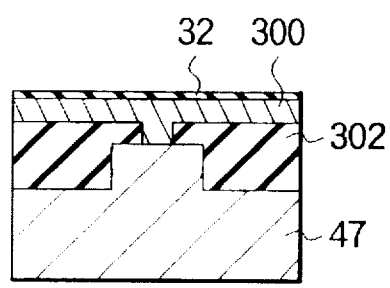
Figure 28E:
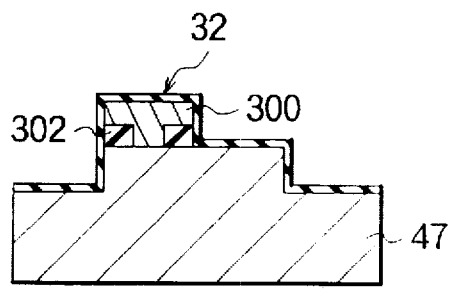

Next, as shown in FIG. 27E and FIG. 28E, a silicon oxide film is formed by using the thermal oxidation method or the like, and a silicon nitride film is formed on that silicon oxide film. The silicon nitride film is formed by for example a CVD process. The thickness of the silicon oxide film is not particularly limited, but is for example about 1.0 to 3.0 nm. The thickness of the silicon nitride film is about 2.0 to 20.0 nm.

Thereafter, the surface of the silicon nitride film is thermally oxidized to form a silicon oxide film having a thickness of for example about 2.0 to 6.0 nm. The first gate insulating layer 32 comprising the ONO film is constituted by the silicon oxide film, the silicon nitride film, and the other silicon oxide film.

Figure 27F:
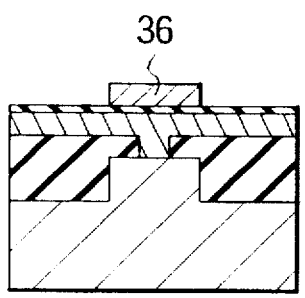
Figure 28F:
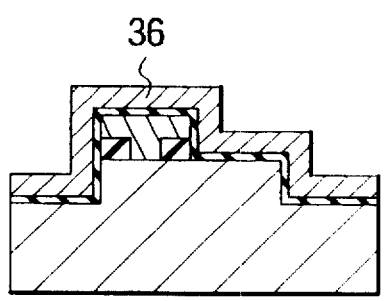

Next, as shown in FIG. 27F and FIG. 28F, as the gate material which becomes the first gate electrode 36, for example, a polycrystalline silicon film or "polycide" film is formed by CVD or the like and is etched for the patterning of the first gate electrode 36. Subsequently, the portion beneath of the first gate electrode 36 other than the first gate insulating layer 32 is removed by etching. Of course, it is also possible to leave the ONO film.

Figure 27G:
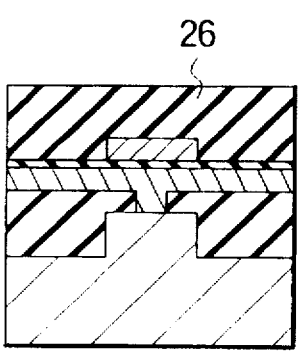
Figure 28G:
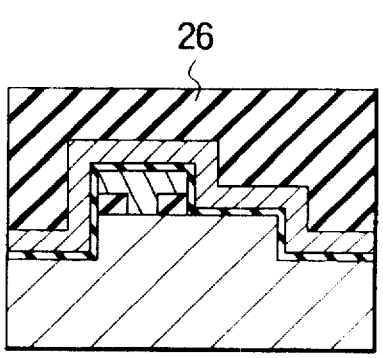

Next, as shown in FIG. 27G and FIG. 28G, an SOI type insulating layer 26 is formed on the semiconductor substrate 47 on which the first gate electrode 36 is formed. This insulating layer 26 is constituted by silicon oxide formed by for example a CVD process.

Figure 27H:
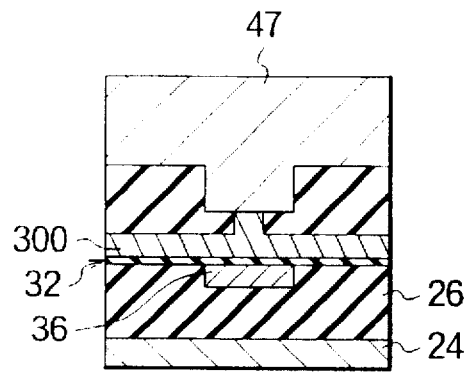
Figure 28H:
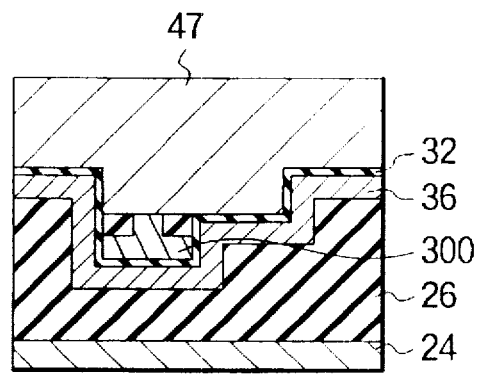

Next, as shown in FIG. 27H and FIG. 28H, the supporting substrate 24 is bonded to the surface of the SOI type insulating layer 26. In actuality, a leveling use polycrystalline silicon layer is deposited on the surface of the insulating layer 26 by CVD or the like and leveled by polishing the surface thereof by CMP or the like, and the supporting substrate 24 constituted by a silicon wafer or the like is bonded to that leveled surface. Namely, the method of forming the SOI structure according to the present embodiment is a so-called bonding SOI method.

Figure 27I:
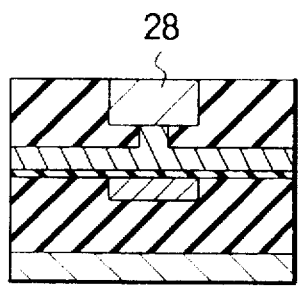
Figure 28I:
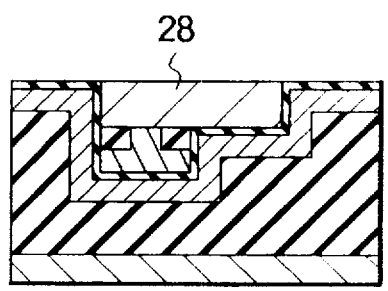

Next, as shown in FIG. 27I and FIG. 28I, the assembly is turned upside-down and the surface of the semiconductor substrate 47 is polished by the CMP process or the like until the surface of the insulating layer 26 is exposed. The SOI type semiconductor layer 28 constituted by the silicon single crystal is left at the part corresponding to the step difference 48 (semiconductor layer projection 28a). The thickness of the SOI type semiconductor layer 28 left on the SOI type insulating layer 26 is a thickness of an extent that the field of one surface of the semiconductor layer 28 influences the other surface and for example is about 100 nm or less.

Figure 27J:
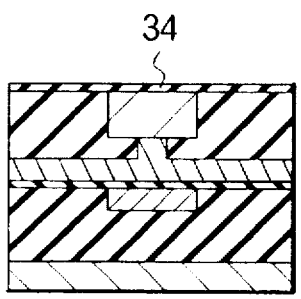
Figure 28J:
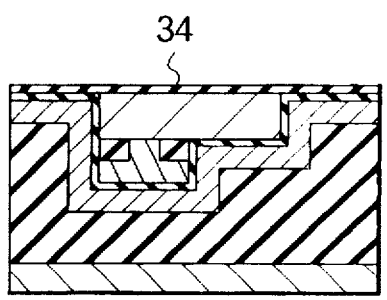

Next, as shown in FIG. 27J and FIG. 28J, the second gate insulating layer 34 is formed on the surface of the semiconductor layer 28. This second gate insulating layer 34 is constituted by for example a silicon oxide film and formed by a CVD process or the like. The thickness of this second gate insulating layer 34 is not particularly limited, but for example is about 2.0 to 10.0 nm. Note that, it is also possible to introduce an impurity for adjustment of the threshold value into the semiconductor layer 28 before or after the formation of the second gate insulating layer 34, but in the present embodiment, the introduction of the impurity can be omitted by setting the difference of the work functions between the gate material and the semiconductor layer to an appropriate value.

Next, as the gate material layer which becomes the second gate electrode 38, for example, a polycrystalline silicon film or the "polycide" film is deposited on the second gate insulating layer 34 by a CVD process or the like. The gate material layer is patterned by RIE or the like to form the second gate electrode 38. Next, the ion implantation of the impurity is carried out in a self-aligning manner with respect to this second gate electrode 38 to form the source-drain regions 40 and 42 on the semiconductor layer 28. The conditions for the ion implantation are not particularly limited, but As is used as the impurity, and the ion implantation is carried out under conditions of 40 to 80 KeV, $3 \times 10^{15}$ to $5 \times 10^{15}/cm^2$. The channel region 30 is formed in the semiconductor layer 28 just beneath of the second gate electrode 38 to which the impurity is not introduced.

Thereafter, the interconnection layers 44 and 46 connected to the source-drain regions 40 and 42 are formed by a polycrystalline silicon interconnection layer, aluminum interconnection layer, aluminum alloy interconnection layer, or the like.

By the process as described above, the memory cells of the non-volatile semiconductor memory device 22c shown in FIG. 26A and FIG. 26C are produced.

In the non-volatile semiconductor memory device according to the present embodiment, in addition to the effect of the third embodiment, since the draining electrode 300 for draining the charges existing in the semiconductor layer 28 is provided, the potential of the semiconductor layer 28 can be freely set, whereby there is an advantage that uniform circuit operation can be guaranteed.

Figure 29A:
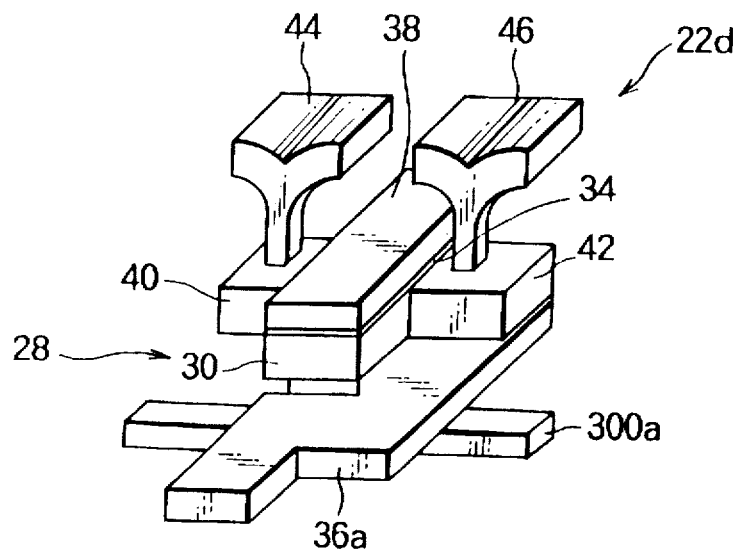
FIG. 29A is a view schematically showing the non-volatile memory cell of a 22nd embodiment by a perspective view.
Figures 29B, 29C:
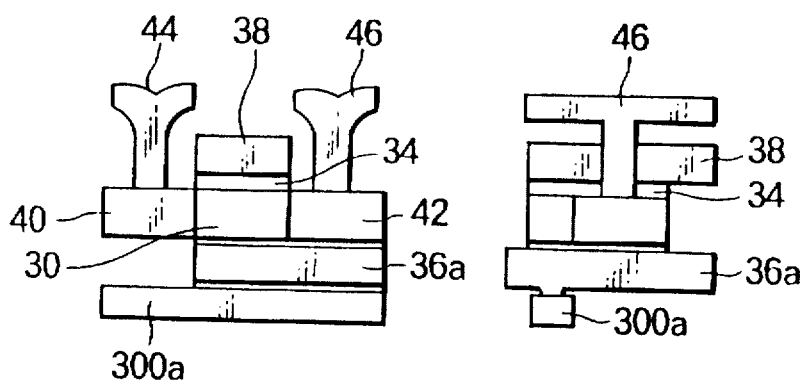
FIG. 29B is a view of the non-volatile memory cell of FIG. 29A seen from the front.
FIG. 29C is a view of the non-volatile memory cell of FIG. 29A seen from the side.

In the 22nd embodiment of the present invention, as shown in FIGS. 29A to 29C, a non-volatile semiconductor memory device 22nd embodiment is produced similar to the 21st embodiment except the first gate electrode 36a is formed so as to bypass the draining electrode 300a, the formation of the draining electrode 300a and the formation of the ONO film and the back surface gate are reversed in order, and the back surface gate mask is slightly changed.

In the present embodiment, the same action and effect as those by the 21st embodiment can be expected.

Figure 30:
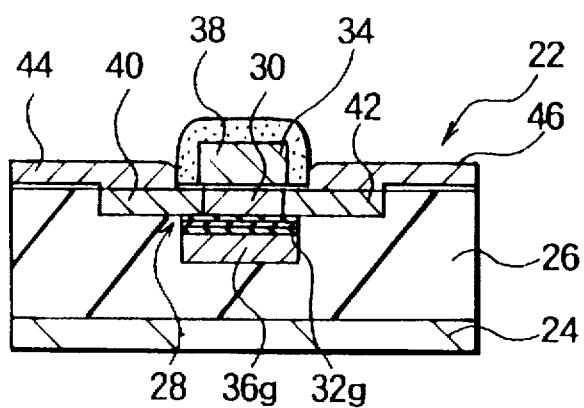
FIG. 30 is a sectional view of the principal parts of the non-volatile memory cell of the 23rd embodiment.

The 23rd embodiment of the present invention is a modification of the third to 12th embodiments. Here, the structure thereof is shown in FIG. 30 in comparison with the third embodiment.

In the present embodiment, the first gate electrode 36g formed in the SOI type insulating layer 26 is not positively processed to the same size as that of the second gate electrode 38, which exerts an influence upon the design rule, but is formed larger than the second gate electrode 38.

Specifically, in the plane direction of the channel region 30, it is formed so that the region overlapping the source-drain diffusion layers 40 and 42 of the first gate electrode 36g becomes larger than the second gate electrode 38.

The rest of the structure is the same as that of FIG. 4. In the present embodiment, the same action and effect as those by the fourth embodiment can be expected.

What is claimed is:

1. A non-volatile semiconductor memory device with reduced read disturb comprising:

a semiconductor layer having a first surface and a second surface;

a first insulating layer formed on said first surface and a second insulating layer formed on said second surface; and a first gate electrode formed on said first insulating layer and a second gate electrode formed on said second insulating layer;

a charge storing means located in said first insulating layer; and a channel region formed in said semiconductor layer between said first gate electrode and said second gate electrode;

wherein a thickness of said semiconductor layer at said channel region is such that a first electric field of said first surface of said semiconductor layer exerts an influence on a second electric field of said second surface of said semiconductor layer such that both a first gate threshold voltage measured with respect to said first gate electrode and a second gate threshold voltage measured with respect to said second gate electrode are changed by a charge stored in said charge storing means; and said thickness of said semiconductor layer "d" being determined by the following equation:

$$d \leq (4\epsilon\phi_F/qN_B)^{1/2}$$

where:

$$\phi_F = (kT/q)(\ln(N_B/n_i));$$

$\epsilon$ is the dielectric constant of said semiconductor layer;
q is the amount of the charge of an electron;
$N_B$ is the concentration of impurities in said channel region;
k is Boltzmann's constant;
T is absolute temperature; and
$n_i$ is the intrinsic carrier concentration of said semiconductor layer.

2. A non-volatile semiconductor memory as set forth in claim 1, wherein:
said first gate electrode is a write electrode; and
said second gate electrode is a read electrode.

3. A non-volatile semiconductor memory device as set forth in claim 1, wherein said charge storing means comprises a multi-layer insulating film.

4. A non-volatile semiconductor memory device as set forth in claim 1, wherein said charge storing means comprises a floating gate buried in said first insulating layer.

5. A non-volatile semiconductor memory device as set forth in claim 1, wherein said charge storing means comprises a ferroelectric layer disposed on said first insulating layer.

6. A non-volatile semiconductor memory device as set forth in claim 1, further comprising:
a supporting substrate;
a third insulating layer formed on said substrate; and
a source region and a drain region formed on said third insulating layer spaced apart from each other, wherein said source and drain regions are each in contact with said channel region.

7. A non-volatile semiconductor memory device as set forth in claim 1 wherein said semiconductor layer is formed by epitaxial growth.

8. A non-volatile semiconductor memory device as set forth in claim 6, wherein said supporting substrate is a semiconductor substrate and said semiconductor layer is formed by lateral epitaxial growth from said semiconductor substrate via a connecting opening provided in said third insulating layer.

9. A non-volatile semiconductor memory device as set forth in claim 1, wherein a plurality of channel regions are connected in series in said semiconductor layer.

10. A non-volatile semiconductor memory device as set forth in claim 1, wherein an electrode is provided for draining the charges in the channel formed in said semiconductor layer.

11. A non-volatile semiconductor memory device as set forth in claim 1, wherein the lengths of the first gate electrode and second gate electrode in the channel direction are different.

12. A non-volatile semiconductor memory device as set forth in claim 6, wherein said third insulating layer is formed directly on said supporting substrate.

13. A non-volatile semiconductor memory device as set forth in claim 6, wherein said source and drain regions are formed directly on said third insulating layer.

14. A non-volatile semiconductor memory device as set forth in claim 1, wherein said thickness of said semiconductor layer is 100 nm or less.

15. A non-volatile semiconductor memory device as set forth in claim 2, wherein said first gate electrode is also an erase electrode.

16. A non-volatile semiconductor memory device as set forth in claim 2, wherein said first insulating layer is approximately 4 nm thick so as to reduce a required write voltage value.

17. A non-volatile semiconductor memory device as set forth in claim 2, wherein said second insulating layer is approximately 6 to 8 nm thick.

* * * * *

UNITED STATES PATENT AND TRADEMARK OFFICE
CERTIFICATE OF CORRECTION

PATENT NO. : 5,751,037
DATED : May 12, 1998
INVENTOR(S) : Hiroshi AOZASA and Yutaka HAYASHI It is certified that error appears in the above-identified patent and that said Letters Patent is hereby corrected as shown below:

In column 3, line 38, $$"d \leq (4\varepsilon\phi_F / qN_B)1^{/2}"$$

should read as $$-- d \leq (4\varepsilon\phi_F / qN_B)^{1/2} --.$$

In column 3, line 46, $$"d \leq (\varepsilon kT / 2n_i q^2)1^{/2}"$$

should read as $$-- d \leq (\varepsilon kT / 2n_i q^2)^{1/2} --.$$

UNITED STATES PATENT AND TRADEMARK OFFICE
CERTIFICATE OF CORRECTION

PATENT NO. : 5,751,037
DATED : May 12, 1998
INVENTOR(S) : Hiroshi AOZASA and Yutaka HAYASHI It is certified that error appears in the above-identified patent and that said Letters Patent is hereby corrected as shown below:

In column 27, line 6, $$"d \leq (4\varepsilon\phi_F / qN_B^{1/2}"$$

should read as $$-- d \leq (4\varepsilon\phi_F / qN_B)^{1/2} --.$$

In column 27, line 10, $$"\phi_F = (kT/q)(\ln(N_B n_i)"$$

should read as $$-- \phi_F = (kT/q)(\ln(N_B n_i)) --.$$

Signed and Sealed this

Twenty-second Day of June, 1999

Attest:

Q. TODD DICKINSON

*Attesting Officer*  Acting Commissioner of Patents and Trademarks